United States Patent
Itou

(10) Patent No.: US 12,191,431 B2
(45) Date of Patent: Jan. 7, 2025

(54) DISPLAY DEVICE

(71) Applicant: Japan Display Inc., Tokyo (JP)

(72) Inventor: Osamu Itou, Tokyo (JP)

(73) Assignee: Japan Display Inc., Tokyo (JP)

( * ) Notice: Subject to any disclaimer, the term of this patent is extended or adjusted under 35 U.S.C. 154(b) by 533 days.

(21) Appl. No.: 17/586,922

(22) Filed: Jan. 28, 2022

(65) Prior Publication Data

US 2022/0158049 A1 May 19, 2022

Related U.S. Application Data

(63) Continuation of application No. PCT/JP2020/028129, filed on Jul. 20, 2020.

(30) Foreign Application Priority Data

Aug. 23, 2019 (JP) .................................. 2019-152845

(51) Int. Cl.
 *H01L 33/60* (2010.01)
(52) U.S. Cl.
 CPC .................................. *H01L 33/60* (2013.01)
(58) Field of Classification Search
 CPC . H01L 25/0753; H01L 25/167; H01L 27/156; H01L 33/60; H10K 59/878
 See application file for complete search history.

(56) References Cited

U.S. PATENT DOCUMENTS

2017/0084803 A1 3/2017 Iwaki
2017/0117505 A1* 4/2017 Kwon .................. H10K 59/878

FOREIGN PATENT DOCUMENTS

WO  WO 2012/043172 A1  4/2012

OTHER PUBLICATIONS

International Search Report issued Oct. 6, 2020 in PCT/JP2020/028129 filed on Jul. 20, 2020, 2 pages.
Office Action issued on Jul. 4, 2023, in corresponding Japanese Application No. 2019-152845, 6 pages.

* cited by examiner

*Primary Examiner* — Peter M Albrecht
(74) *Attorney, Agent, or Firm* — Maier & Maier, PLLC

(57) ABSTRACT

A display device includes a light emitting element and an optical adjustment layer over the light emitting element. The optical adjustment layer includes a reflective film, a light transmitting wall over the reflection film, and a light transmitting film in contact with a side surface of the reflective film and a side surface of the light transmitting wall. A refractive index of the light transmitting wall is larger than a refractive index of the light transmitting film.

19 Claims, 26 Drawing Sheets

DISPLAY DEVICE

CROSS REFERENCE TO RELATED APPLICATIONS

This application is based on and claims the benefit of priority from the prior Japanese Patent Application No. 2019-152845, filed on Aug. 23, 2019, and the PCT Application No. PCT/JP2020/028129, filed on Jul. 20, 2020, the entire contents of which are incorporated herein by reference.

BACKGROUND OF THE INVENTION

Field

One embodiment of the present invention relates to a display device, particularly a display device using a micro LED.

Description of the Related Art

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

On the other hand, a so-called micro LED display in which minute micro LEDs are placed in pixels has been developed as a next-generation display. The micro LEDs are self-emitting elements similar to the OLEDs, but unlike OLEDs, the micro LEDs are composed of inorganic compounds containing gallium (Ga) or indium (In). Therefore, it is easier to ensure a highly reliable micro LED display as compared with the OLED display. In addition, micro LEDs have high light emission efficiency and high brightness. Therefore, the micro LED display is expected to be the next generation display with high reliability, high brightness, and high contrast.

Generally, an LED emits light not only from the top surface of the LED corresponding to the display surface of the display, but also from the side surface of the LED. If the light emitted from the side surface of the LED can be used in the display, not only the brightness of the display can be increased, but also the power consumption can be reduced. Therefore, for example, a method is disclosed (for example, see Japanese Patent Application Laid-Open No. 2017-59818) of changing the traveling direction of the light in a configuration in which the LED is arranged on the bottom surface in the recessed portion and the reflector is provided on the side surface in the recessed portion, the light emitted from the side surface of the LED is reflected by the reflector.

SUMMARY OF THE INVENTION

A display device according to an embodiment of the present invention includes a light emitting element and an optical adjustment layer over the light emitting element. The optical adjustment layer includes a reflective film, a light transmitting wall over the reflection film, and a light transmitting film in contact with a side surface of the reflective film and a side surface of the light transmitting wall. A refractive index of the light transmitting wall is larger than a refractive index of the light transmitting film.

Further, a display device according to an embodiment of the present invention includes a light emitting element over a substrate and an optical adjustment layer over the light emitting element. The optical adjustment layer includes a first structure including a first reflective film and a first light transmitting wall over the first reflective film, a second structure including a second reflective film and a second light transmitting wall over the second reflective film, and a light transmitting film in contact with a side surface of the first structure and a side surface of the second structure. The first structure is provided in a region that does not overlap the light emitting element. The second structure is provided in a region that overlaps the light emitting element. A refractive index of the first light transmitting wall and a refractive index of the second light transmitting wall are larger than a refractive index of the light transmitting film.

Furthermore, a display device according to an embodiment of the present invention includes a light emitting element over a substrate and an optical adjustment layer over the light emitting element. The optical adjustment layer includes a lower structure including a reflective film and a first light transmitting wall over the reflective film, an upper structure including a second light transmitting wall, over the lower structure, and a light transmitting film in contact with a side surface of the lower structure and a side surface of the upper structure. An area of a lower surface of the lower structure is larger than an area of a lower surface of the upper structure. A refractive index of the first light transmitting wall and a refractive index of the second light transmitting wall are larger than a refractive index of the light transmitting film.

DESCRIPTION OF EMBODIMENTS

Figure 1:
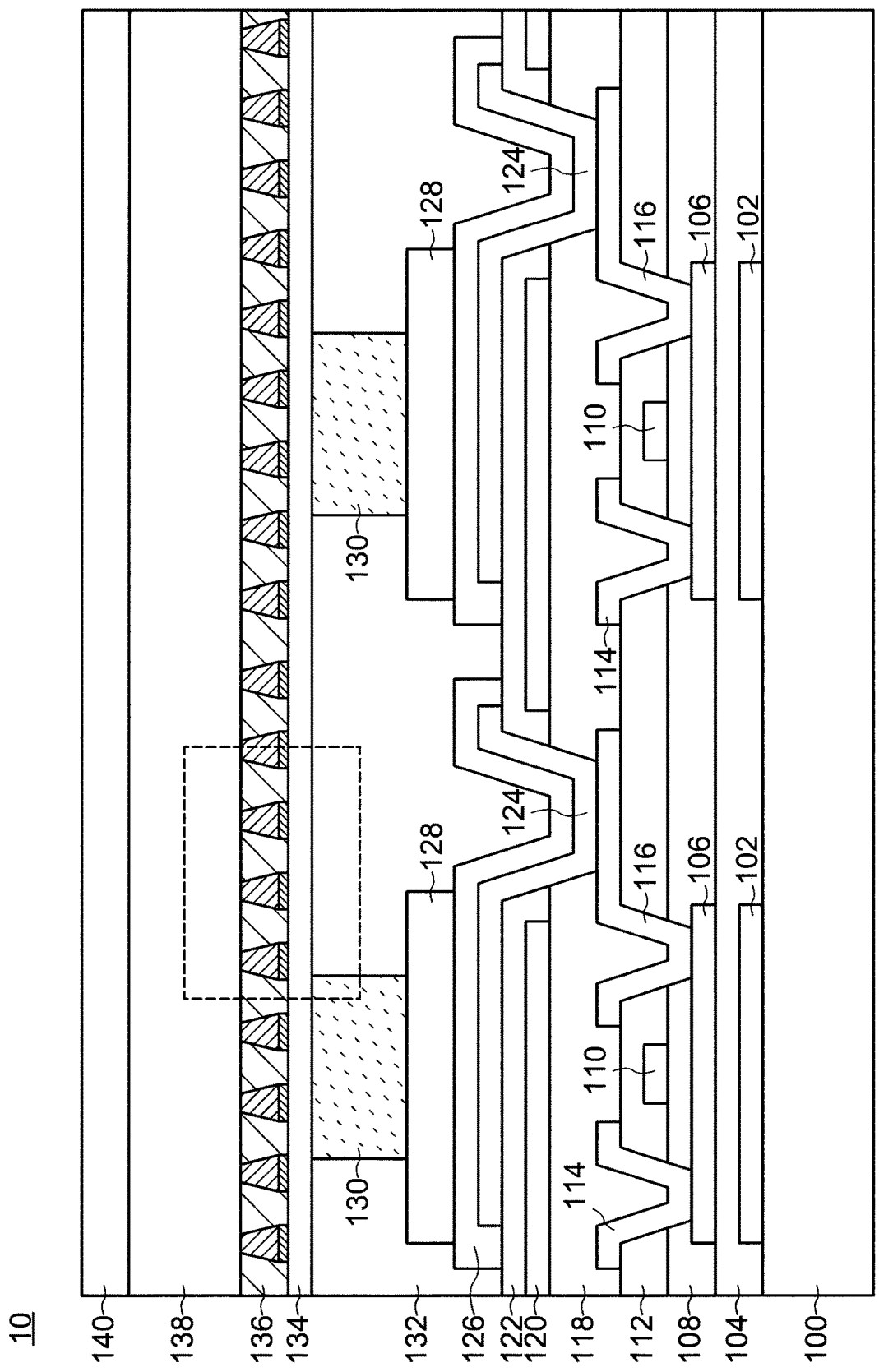
FIG. 1 is a schematic cross-sectional view of a display device according to an embodiment of the present invention.

For a mini LED or a micro LED of small size, it is very difficult to place the mini LED or micro LED in a recessed portion. Further, since the material which forms the micro LED is a high refractive index material, light is reflected even on the side surface of the micro LED. In the micro LED display in which a large number of micro LEDs are arranged, there is also a problem whereby the incident external light is reflected by the side surface of the micro LEDs and the contrast is decreased.

In view of the above problems, one object of an embodiment of the present invention is to improve the light extraction efficiency on the display surface of the display device by changing the light emitted from the side surface of the light emitting element provided in the display device to the direction of the upper surface of the light emitting element. Further, one object of an embodiment of the present invention is to reduce the reflection of external light of the display device.

Hereinafter, embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a light emitting element over the substrate, one surface of the structure facing the substrate is the bottom surface of the light emitting element and the other surface is the top surface of the light emitting element. In addition, the expression "the light emitting element over the substrate" only explains the vertical relationship between the substrate and the light emitting element, and another member may be placed between the substrate and the light emitting element. Furthermore, the terms "above" or "above direction" or "below" or "below direction" mean the order of stacked layers in the structure in which a plurality of layers are stacked, and may not be related to the position in which layers overlap in a plan view.

In this specification, a "display device" is intended to include a wide range of devices that display a still image or moving images using the light emitting element, and may include not only a display panel and a display module but also a device to which other optical members (for example, a polarizing member or touch panel, etc.) are attached.

The following embodiments can be combined with each other as long as there is no technical contradiction.

First Embodiment

A display device according to an embodiment of the present invention is described with reference to FIGS. 1 to 2B.

[Configuration of Display Device 10]

FIG. 1 is a schematic cross-sectional view of a display device 10 according to an embodiment of the present invention.

As shown in FIG. 1, the display device 10 includes a substrate 100, a light shielding layer 102, an undercoat layer 104, a semiconductor layer 106, a first insulating layer 108, a first wiring layer 110, a second insulating layer 112, a second wiring layer. 114, a third wiring layer 116, a first flattening layer 118, a fourth wiring layer 120, a third insulating layer 122, a fifth wiring layer 124, a sixth wiring layer 126, a seventh wiring layer 128, a light emitting element 130, a second flattening layer 132, an eighth wiring layer 134, an optical adjustment layer 136, an overcoat layer 138, and a polarizing layer 140.

The substrate 100 can support each layer. A flexible substrate containing a resin such as a polyimide substrate, an acrylic substrate, a siloxane substrate, or a fluororesin substrate can be used as the substrate 100. Impurities may be introduced into the above resin in order to improve the heat resistance of the substrate 100. If the substrate 100 is not required to be transparent, impurities that reduce the transparency of the substrate 100 can be used. On the other hand, when the substrate 100 is not required to have flexibility, a rigid substrate having transparency and not flexibility such as a glass substrate, a quartz substrate, or a sapphire substrate may be used as the substrate 100. Further, a substrate having no transparency such as a silicon substrate, or a silicon carbide substrate, a semiconductor substrate such as a compound semiconductor substrate, or a conductive substrate such as a stainless steel substrate can be used as the substrate 100. Further, a substrate on which a silicon oxide film or a silicon nitride film is formed can also be used as the substrate 100.

The light shielding layer 102 can shield the semiconductor layer 106 from external light. For example, titanium, molybdenum or tungsten, or an alloy or compound thereof can be used as a material of the light shielding layer 102. Further, the light shielding layer 102 may have a laminated structure, for example, the light shielding layer 102 may have a laminated structure of aluminum and the above material.

The undercoat layer 104 can prevent the diffusion of impurities into the semiconductor layer 106. For example, a silicon oxide film, a silicon nitride film, or a laminated film thereof can be used as a material of the undercoat layer 104. A configuration that is not provided with the undercoat layer 104 can also be used.

The semiconductor layer 106, the first insulating layer 108, the first wiring layer 110, the second insulating layer 112, the second wiring layer 114, and the third wiring layer 116 include a so-called transistor configuration. That is, the semiconductor layer 106, the first insulating layer 108, the first wiring layer 110, the second insulating layer 112, the second wiring layer 114, and the third wiring layer 116 function as a semiconductor film, a gate insulating film, a gate electrode, an interlayer insulating film, a source electrode, and a drain electrode, respectively. Further, the second wiring layer 114 and the third wiring layer 116 may function as a drain electrode and a source electrode, respectively.

The transistor shown in FIG. 1 is a top gate type transistor. The first insulating layer 108 (the gate insulating film) is provided on the semiconductor layer 106 (the semiconductor film). The first wiring layer 110 (the gate electrode) is provided on the first insulating layer 108 (the gate insulating film). The second insulating layer 112 (the interlayer insulating film) is provided on the first wiring layer 110 (the gate electrode). The first insulating layer 108 (the gate insulating film) and the second insulating layer 112 are provided with opening portions, and the second wiring layer 114 (the source electrode) and the third wiring layer 116 (the drain electrode) are electrically connected to the semiconductor layer 106 (the semiconductor layer) via the opening portions. The transistor applied to the display device 10 of the present embodiment is not limited to the top gate type transistor. The transistor may also be a bottom gate type transistor.

A semiconductor material capable of forming a channel region can be used for the semiconductor layer 106. For example, silicon, an oxide semiconductor such as IGZO or ZnO, or a compound semiconductor such as GaAs or GaN can be used as the semiconductor material. When the semiconductor material is silicon, amorphous silicon, polysilicon, or single crystal silicon may be used.

An insulating material can be used for each of the first insulating layer 108 and the second insulating layer 112. For example, silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), or the like can be used as the insulating material. Here, $SiN_xO_y$ and $AlN_xO_y$ are silicon compounds and aluminum compounds containing oxygen in an amount smaller than nitrogen. Further, $SiO_xN_y$ and $AlO_xN_y$ are silicon compounds and aluminum compounds containing nitrogen in an amount smaller than oxygen. In addition, each of the first insulating layer 108 and the second insulating layer 112 can use not only an inorganic insulating material as described above but also an organic insulating material. A polyimide resin, an acrylic resin, an epoxy resin, a silicone resin, a fluororesin, a siloxane resin, or the like can be used as the organic insulating material. In each of the first insulating layer 108 and the second insulating layer 112, the inorganic insulating layer material and the organic insulating material may be used alone, or these may be laminated.

A metal material can be used for each of the first wiring layer 110, the second wiring layer 114, and the third wiring layer 116. For example, copper (Cu), aluminum (Al), titanium (Ti), chromium (Cr), cobalt (Co), nickel (Ni), molybdenum (Mo), hafnium (Hf), tantalum (Ta), tungsten (W), or bismus (Bi), or alloys or compounds thereof can be used as the metal material. Further, each of the first wiring layer 110, the second wiring layer 114, and the third wiring layer 116 can be laminated with the above-mentioned metal material. Furthermore, the second wiring layer 114 and the third wiring layer 116 can also be used as materials for current supply wiring.

The first flattening layer 118 can flatten unevenness of the transistor. For example, an acrylic resin or a polyimide resin can be used as a material of the first flattening layer 118.

The fourth wiring layer 120 can function as a common electrode. A transparent conductive material such as indium tin oxide (ITO) or indium zinc oxide (IZO) can be used as a material of the fourth wiring layer 120.

The third insulating layer 122 can function as a capacitance dielectric. For example, silicon nitride can be used as a material of the third insulating layer 122.

The fifth wiring layer 124 can function as a pixel electrode. For example, a transparent conductive material such as indium tin oxide (ITO) or indium zinc oxide (IZO) can be used as a material of the fifth wiring layer 124.

The sixth wiring layer 126 can function as a cathode. For example, a transparent conductive material such as indium tin oxide (ITO) or indium zinc oxide (IZO), or a metal material such as silver (Ag) can be used as a material of the sixth wiring layer 126. Further, the sixth wiring layer 126 may have a laminated structure of these materials. For example, a structure such as ITO/Ag/ITO can be used as the laminated structure.

The seventh wiring layer 128 can function as a connection layer for connecting an electrode provided in the light emitting element 130 and the sixth wiring layer 126 (cathode) provided on the substrate 100 side. For example, silver paste or solder can be used for the seventh wiring layer 128.

For example, the light emitting element 130 is a light emitting diode (LED). The light emitting diode includes a mini LED or a micro LED.

Figure 19:
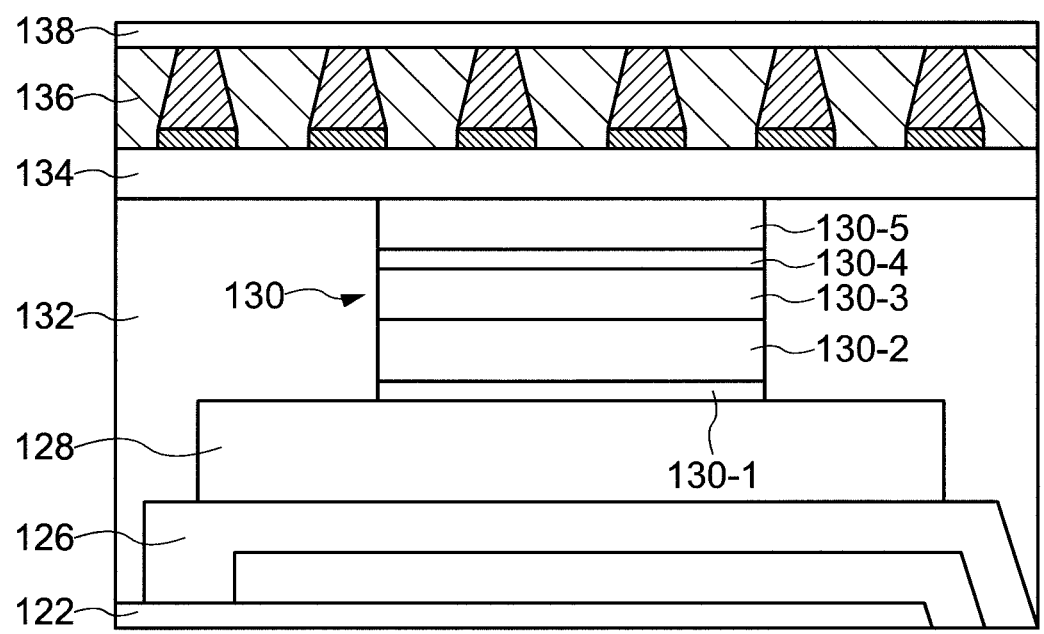
FIG. 19 is a schematic cross-sectional view of a light emitting element of a display device according to an embodiment of the present invention.

Here, a structure of the display device 10 using the light emitting diode as the light emitting element 130 is described with reference to FIG. 19. FIG. 19 is a schematic cross-sectional view of the light emitting element 130 of the display device 10 according to the present embodiment.

As shown in FIG. 19, the light emitting diode as the light emitting element 130 includes a light emitting diode electrode 130-1, a light emitting diode substrate 130-2, an n-type clad layer 130-3, a light emitting layer 130-4, and a p-type clad layer 130-5.

When the light emitting element 130 is a blue light emitting diode, the material which forms the light emitting layer 130-4 includes indium, gallium, and nitrogen. The composition ratio of indium to gallium is typically indium:gallium=0.2:0.8. The material of each of the p-type clad layer 130-5 and the n-type clad layer 130-3 is gallium nitride, and the material of the light emitting diode substrate 130-2 is silicon carbide.

When the light emitting element 130 is a green light emitting diode, the material which forms the light emitting layer 130-4 includes indium, gallium, and nitrogen. The composition ratio of indium to gallium is typically indium:gallium=0.44:0.55. The material of each of the p-type clad layer 130-5 and the n-type clad layer 130-3 is gallium nitride, and the material of the light emitting diode substrate 130-2 is silicon carbide.

When the light emitting element 130 is a red light emitting diode, the material which forms the light emitting layer 130-4 includes aluminum, gallium, indium, and phosphorus. The composition ratio of aluminum, gallium, and indium is typically aluminum:gallium:indium=0.225:0.275:0.5. The material of each of the p-type clad layer 130-5 and the n-type clad layer 130-3 is aluminum phosphide indium, and the material of the light emitting diode substrate 130-2 is gallium arsenide.

Aluminum can be used for the light emitting diode electrode 130-1 when either the blue light emitting diode, the green light emitting diode, or the red light emitting diode is used. After the n-type clad layer 130-3, the light emitting layer 130-4, and the p-type clad layer 130-5 are formed over the light emitting diode substrate 130-2, the light emitting diode substrate 130-2 is sliced, and the light emitting diode electrode 130-1 is formed. Further, the light emitting diode substrate 130-2 is diced and separated into individual light emitting diodes. The separated light emitting diode is placed over the sixth wiring layer 126 (the cathode) via the seventh wiring layer 128.

The maximum emission wavelengths of the red light emitting diode, the green light emitting diode, and the blue light emitting diode are typically 645 nm, 530 nm, and 450 nm, respectively.

Figure 20:
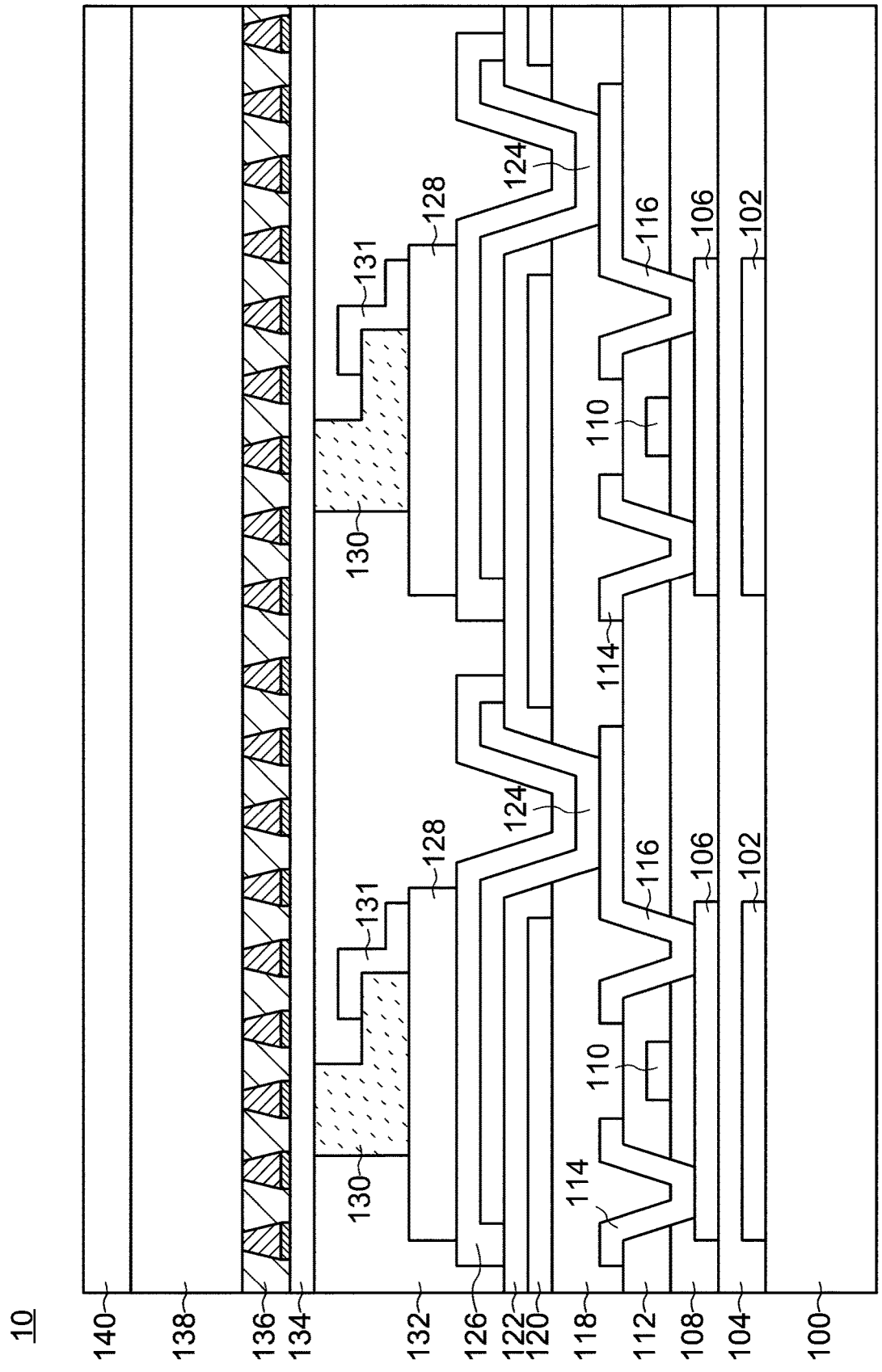
FIG. 20 is a schematic cross-sectional view of a display device according to an embodiment of the present invention in the case where a light emitting diode having a horizontal electrode structure is used for a light emitting element.

Further, the light emitting diode that can be applied to the display device 10 according to the present embodiment is not limited to the light emitting diode having a vertical electrode structure in which the above-mentioned electrodes are arranged in the vertical direction. For example, as shown in FIG. 20, a light emitting diode having a horizontal electrode structure in which the electrodes are arranged in the horizontal direction can also be applied to the display device 10. In FIG. 20, the light emitting diode is electrically connected to the seventh wiring layer 128 by using a cathode connection layer 131. For example, molybdenum or tungsten, or an alloy thereof can be used as a material of the cathode connection layer 131. Further, the cathode connection layer 131 may have a laminated structure, for example, a laminated structure of aluminum and the above material.

The display device 10 is further described by returning to FIG. 1.

The second flattening layer 132 can flatten unevenness of the light emitting element 130. For example, acrylic resin or polyimide resin can be used as a material of the second flattening layer 132.

The eighth wiring layer 134 can function as an anode. For example, a transparent conductive material such as indium tin oxide (ITO) or indium zinc oxide (IZO) can be used as a material of the eighth wiring layer 134.

The details of the optical adjustment layer 136 are described later.

The overcoat layer 138 can reduce any influence (moisture, impact, etc.) from the outside. An inorganic material such as silicon nitride or an organic material such as an acrylic resin or a polyimide resin can be used as a material of the overcoat layer 138. Further, the overcoat layer 138 may have a laminated structure of these materials.

The polarizing layer 140 can adjust the phase of light. In particular, it is preferable that the polarizing layer 140 is a circular polarizing plate that changes incident light into circularly polarized light.

In the display device 10, since the optical adjustment layer 136 is over the light emitting element 130, the optical adjustment layer 136 can be formed without changing the arrangement process of the light emitting element 130. Further, in the display device 10, the light emitted from the side surface of the light emitting element 130 can be changed to the upper surface direction of the light emitting element 130 by the optical adjustment layer 136.

Next, the optical adjustment layer 136 is described.

[Configuration of Optical Adjustment Layer 136]

A configuration of the optical adjustment layer 136 is described with reference to FIGS. 2A and 2B.

Figure 2A:
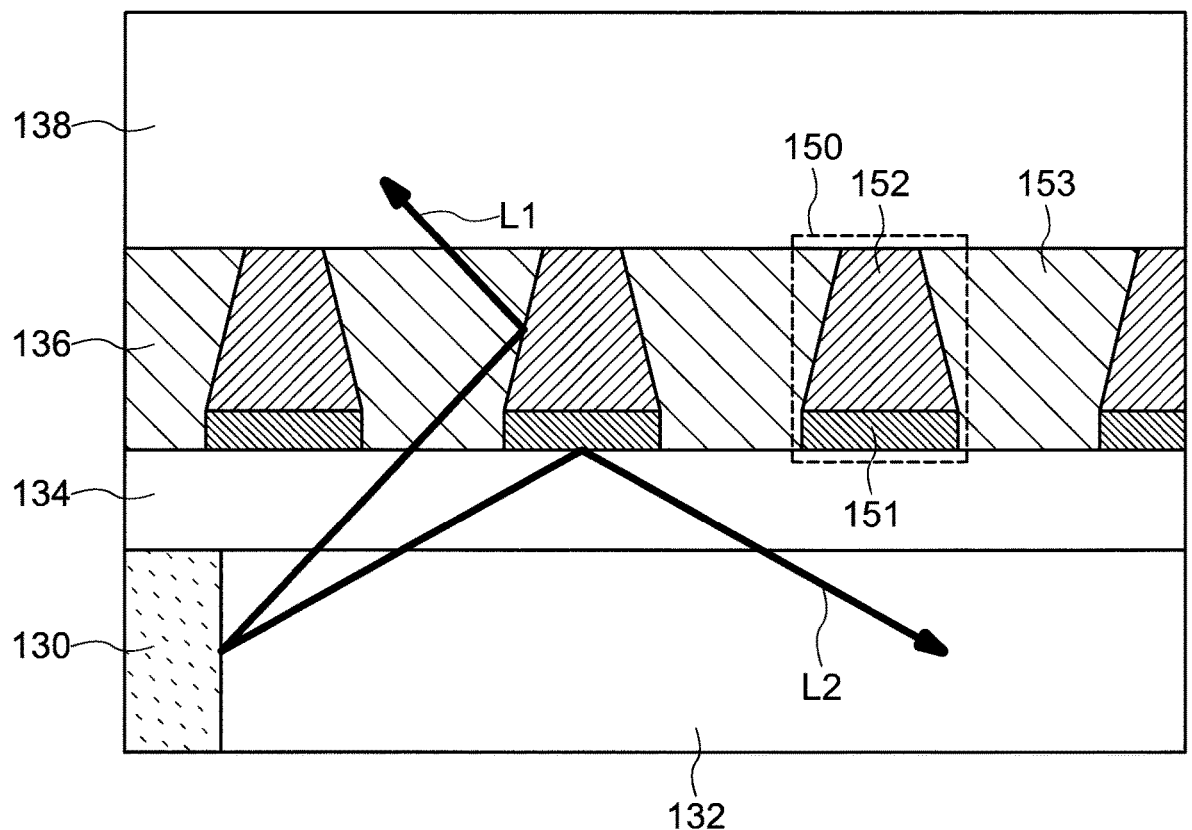
FIG. 2A is a schematic cross-sectional view of a region including an optical adjustment layer of a display device according to an embodiment of the present invention.
Figure 2B:
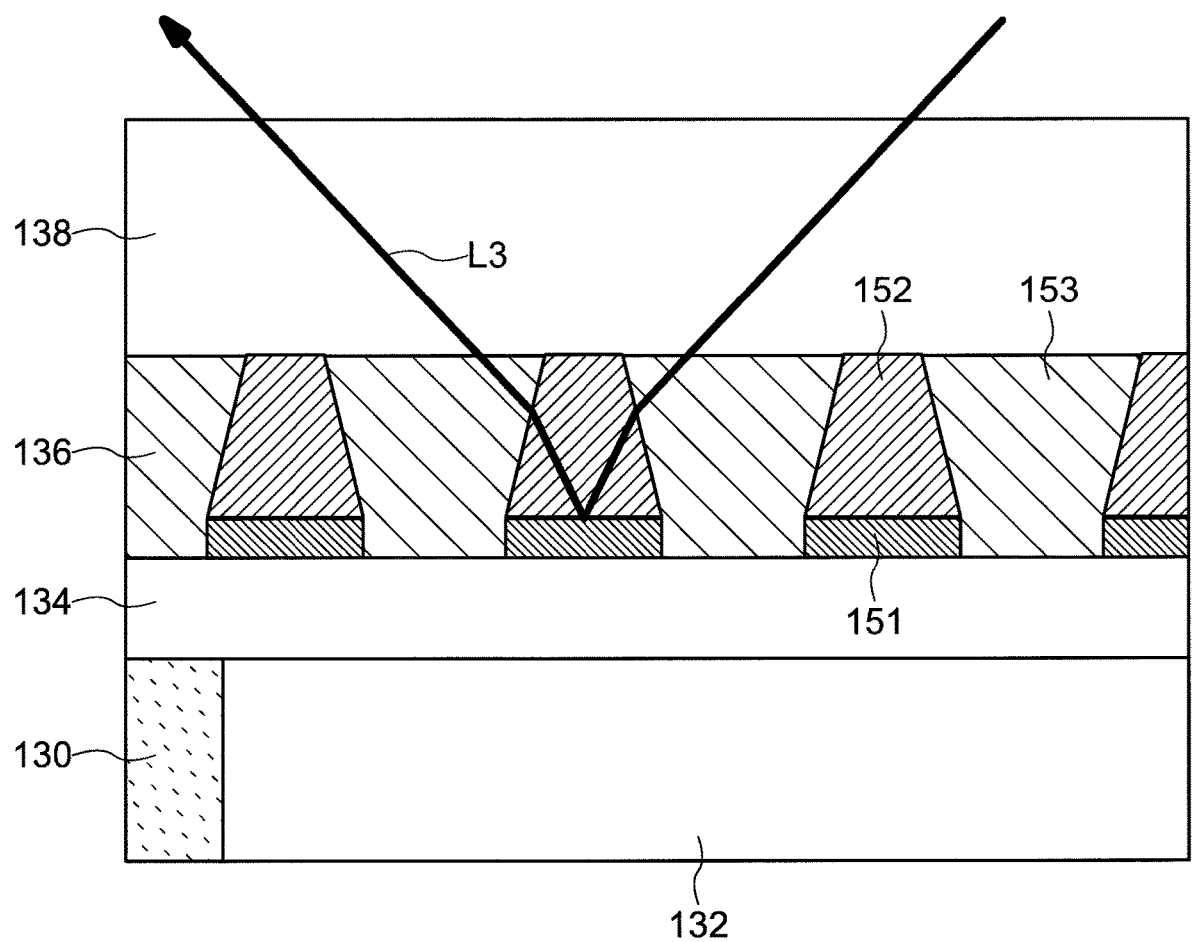
FIG. 2B is an enlarged cross-sectional view of an optical adjustment layer of a display device according to an embodiment of the present invention.

Each of FIGS. 2A and 2B is a schematic cross-sectional view of a region including the optical adjustment layer 136 of the display device 10 according to the embodiment of the present invention. Specifically, each of FIGS. 2A and 2B is an enlarged cross-sectional view of a region surrounded by a broken line shown in FIG. 1.

As shown in FIG. 2A, the optical adjustment layer 136 includes a structure 150 and a light transmitting film 153. The structure 150 includes a reflective film and a light transmitting wall 152 on the reflective film 151. The light transmitting film 153 is provided so as to surround a side surface of the structure 150. In other words, the light transmitting film 153 is provided so as to be in contact with a side surface of the reflective film 151 and a side surface of the light transmitting wall 152.

The side surface of the light transmitting wall 152 has a taper. The taper on the side surface of the light transmitting wall 152 is preferably inclined so that the side surface faces upward. For example, the taper angle (the angle formed by a lower surface of the light transmitting wall 152 and the side surface of the light transmitting wall 152) is greater than or equal to 45 degrees and less than 90 degrees.

The refractive index of the light transmitting wall 152 is larger than the refractive index of the light transmitting film 153. Therefore, the light L1 emitted from the side surface of the light emitting element 130 is reflected at the interface between the light transmitting wall 152 and the light transmitting film 153. That is, the light L1 traveling through the light transmitting film 153 is reflected by the side surface of the light transmitting wall 152 and is extracted from an upper surface of the light transmitting film 153. Therefore, the light emitted from the side surface of the light emitting element 130 is adjusted by the optical adjustment layer 136 so as to be extracted from the upper surface of the light emitting element 130.

For example, a photosensitive material that can be processed by a photolithography process can be used as the material of the light transmitting wall 152 and the light transmitting film 153. For example, a polyimide resin, an acrylic resin, an epoxy resin, a siloxane resin, or the like can be used as the photosensitive material. Among the above-mentioned materials, the light-transmitting wall 152 can be selected from a material having a refractive index larger than a refractive index of the light-transmitting film 153. Further, the larger the difference between the refractive index of the light transmitting wall 152 and the refractive index of the light transmitting film 153, the larger the reflectance at the interface. Therefore, in order to reflect the light emitted from the side surface of the light emitting element 130 by the optical adjustment layer 136 and increase the emission intensity of the light extracted from the upper surface direction of the light emitting element 130, it is preferable that the difference between the refractive index of the light transmitting wall 152 and the refractive index of the transmitting film 153 is increased.

In FIG. 2A, although the upper surface of the light transmitting wall 152 coincides with the upper surface of the light transmitting film 153, the upper surface of the light transmitting wall 152 and the upper surface of the light transmitting film 153 do not have to coincide. That is, the upper surface of the light transmitting wall 152 may be inside the light transmitting film 153. Further, in the case where light scattering is increased, it is preferable to make the structure 150 finer and increase the number of the structures 150. Therefore, it is preferable that the area of the lower surface of the reflective film 151 of the structure 150 is smaller than the area of the upper surface of the light emitting element 130.

The reflective film 151 can reflect the light emitted from the side surface of the light emitting element 130. Therefore, when the light L2 emitted from the side surface of the light emitting element 130 is reflected by the reflective film 151, the light L2 travels toward the lower surface of the optical adjustment layer 136. However, the light L2 is reflected by the reflective film (for example, the first wiring layer 110 to the seventh wiring layer 128, etc.) provided below the optical adjustment layer 136 and is directed toward the optical adjustment layer 136 again. When the light L2 is incident on the lower surface of the light transmitting film 153, the light L2 is reflected by the side surface of the light transmitting wall 152 and is extracted from the upper surface of the light transmitting film 153. Therefore, even when the light emitted from the side surface of the light emitting element 130 is reflected by the reflective film 151, the light is finally adjusted to be extracted from the upper surface of the light emitting element 130 by the optical adjustment layer 136.

The reflective film 151 may be any material that can reflect visible light. For example, silver, titanium, molybdenum, tungsten, or aluminum, or alloys or compounds thereof can be used as a material of the reflective film 151.

FIG. 2B shows a reflection state of external light by the reflective film 151 in the same structure as the optical adjustment layer 136 of FIG. 2A. The phase of the external light L3 traveling through the light transmitting film 153 is adjusted by the polarizing layer 140, and is circularly polarized light. The external light L3 traveling through the light transmitting film 153 is incident on the light transmitting wall 152, reflected by the reflective film 151, emitted from the light transmitting wall 152, and travels toward the polarizing layer 140. Since the phase of the light is hardly changed by the optical adjustment layer 136, the external light L3 reflected by the reflective film 151 is maintained in a circularly polarized state. When the external light L3 reflected by the reflective film 151 is incident on the polarizing layer 140 again, the external light L3 is absorbed by the polarizing layer 140. Therefore, the external light incident on the display device 10 is not extracted from the display device 10, and the decrease in contrast of the display device 10 can be suppressed even under external light.

Figure 3:
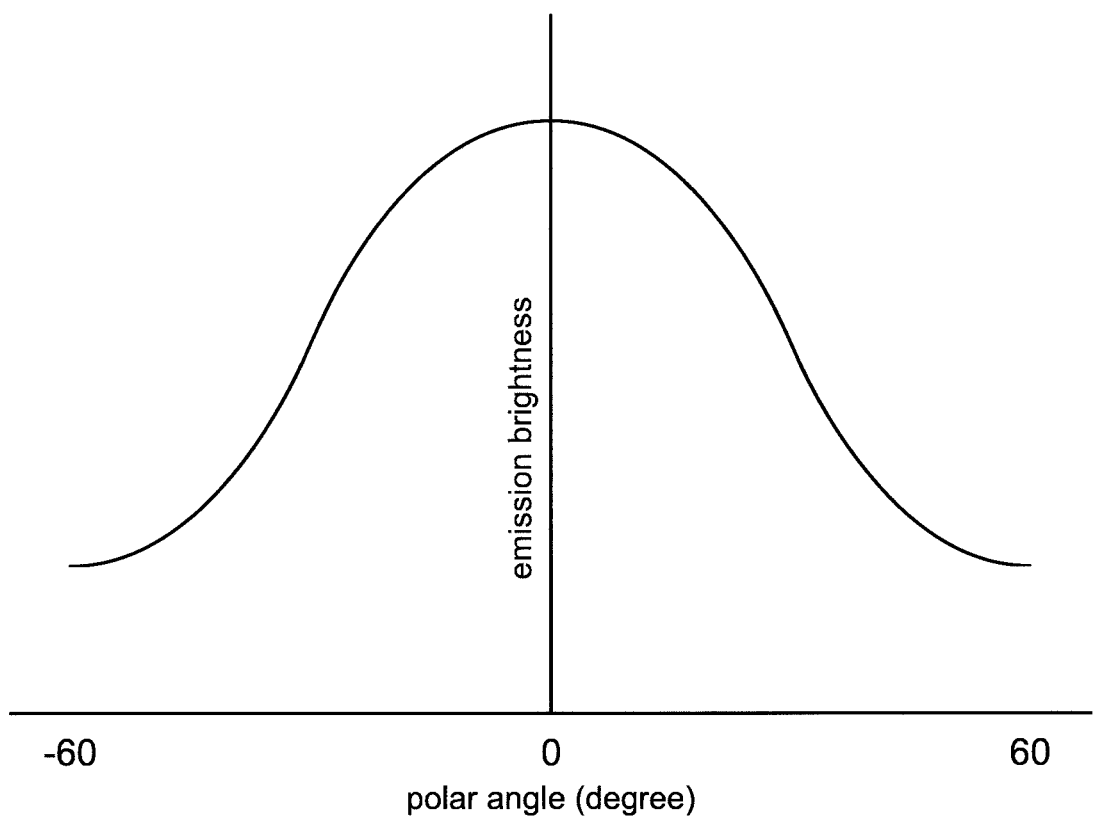
FIG. 3 is a graph showing a polar angle dependence of a display device according to an embodiment of the present invention.
Figure 21A:
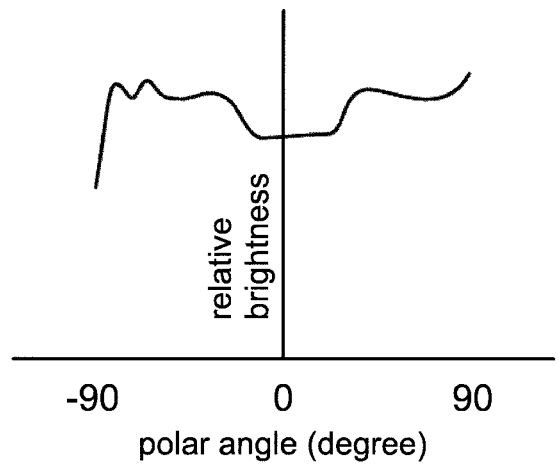
FIG. 21A is a graph showing a polar angle dependence of a display device without an optical adjustment layer as a comparative example.
Figure 21B:
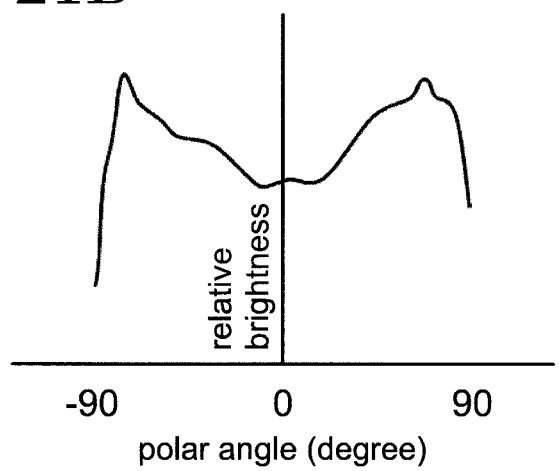
FIG. 21B is a graph showing a polar angle dependence of a display device without an optical adjustment layer as a comparative example.
Figure 21C:
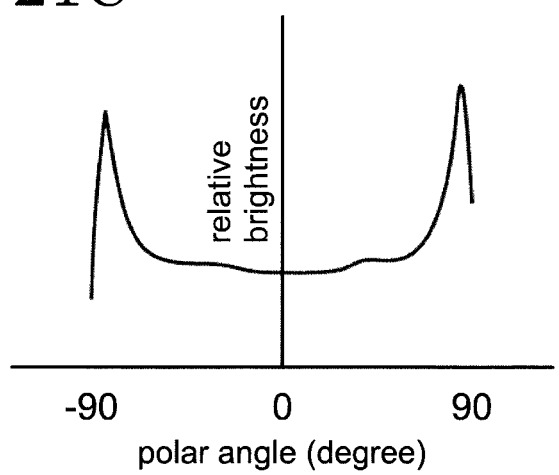
FIG. 21C is a graph showing a polar angle dependence of a display device without an optical adjustment layer as a comparative example.

FIG. 3 is a graph showing a polar angle dependence of the display device 10 according to the embodiment of the present invention. The polar angle of 0 degrees corresponds to the case where the display surface of the display device 10 is viewed from the front. The emission intensity is maximized at a polar angle of 0 degrees. Therefore, in the display device 10, it can be understood that the light emitted from the light emitting element 130 is extracted in the direction of the upper surface of the light emitting element 130, that is, in the direction of the display surface of the display device 10. As a comparative example, FIGS. 21A to 21C show graphs showing a polar angle dependence of the display device not provided with the optical adjustment layer 136. A red light emitting diode, a green light emitting diode, and a blue light emitting diode are included in the display devices of FIGS. 21A, 21B, and 21C, respectively, and in each case are at a maximum at a large polar angle. Therefore, on the display surface of the display device 10, the brightness on the end face side is higher than the brightness on the front side. In the display device 10, by providing the optical adjustment layer 136, the brightness in the front direction of the display surface of the display device 10 is increased, so that the visibility of the display device 10 is improved.

The shape of the light transmitting wall 152 of the display device 10 according to the present embodiment is described with reference to FIGS. 4A to 4H.

FIGS. 4A to 4H are schematic perspective views of the light transmitting wall 152 of the optical adjustment layer 136 of the display device 10 according to the embodiment of the present invention. Specifically, FIGS. 4A to 4H are examples of the shape of the light transmitting wall 152.

Figure 4A:
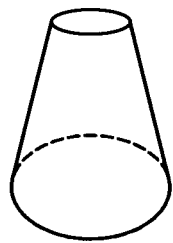
FIG. 4A is a schematic perspective view of a light transmitting wall of an optical adjustment layer of a display device according to an embodiment of the present invention.
Figure 4B:
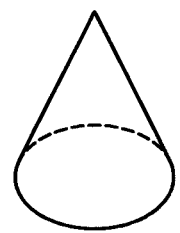
FIG. 4B is a schematic perspective view of a light transmitting wall of an optical adjustment layer of a display device according to an embodiment of the present invention.

The shape of the light transmitting wall 152 shown in FIG. 4A is a truncated cone. A truncated cone is a frustum with a circular bottom surface, which is obtained by cutting a cone in a plane parallel to the bottom surface and removing the portion of the cut cone. Further, the shape of the light transmitting wall 152 shown in FIG. 4B is a cone. The side surfaces of the truncated cone and the cone have a taper.

Figure 4C:
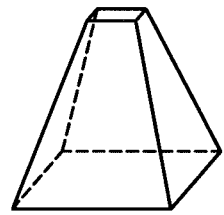
FIG. 4C is a schematic perspective view of a light transmitting wall of an optical adjustment layer of a display device according to an embodiment of the present invention.
Figure 4D:
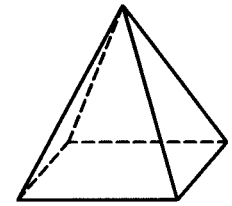
FIG. 4D is a schematic perspective view of a light transmitting wall of an optical adjustment layer of a display device according to an embodiment of the present invention.

The shape of the light transmitting wall 152 shown in FIG. 4C is a quadrangular frustum. A quadrangular frustum is a frustum with a quadrangular bottom surface, which is obtained by cutting a quadrangular pyramid in a plane parallel to the bottom surface and removing the portion of the cut quadrangular pyramid. The shape of the light transmitting wall 152 shown in FIG. 4D is a quadrangular pyramid. The four side surfaces of the quadrangular frustum and the quadrangular pyramid have a taper.

Figure 4E:
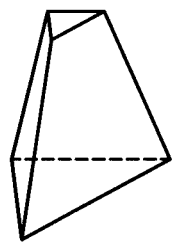
FIG. 4E is a schematic perspective view of a light transmitting wall of an optical adjustment layer of a display device according to an embodiment of the present invention.
Figure 4F:
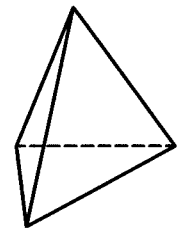
FIG. 4F is a schematic perspective view of a light transmitting wall of an optical adjustment layer of a display device according to an embodiment of the present invention.

The shape of the light transmitting wall 152 shown in FIG. 4E is a triangular frustum. The triangular frustum is a frustum with a triangular bottom surface, which is obtained by cutting a triangular pyramid in a plane parallel to the bottom surface and removing the portion of the cut triangular pyramid. The shape of the light transmitting wall 152 shown in FIG. 4F is a triangular pyramid. The three side surfaces of triangular frustum and the triangular pyramid have a taper.

Although the shapes of the bottom surface of the light transmitting wall 152 shown in FIGS. 4C to 4F are triangular or quadrangular, the shape of the bottom surface is not limited thereto. The shape of the bottom surface of the light transmitting wall 152 can be polygonal. That is, the shape of the light transmitting wall 152 can be a polygonal frustum or a polygonal pyramid.

Figure 4G:
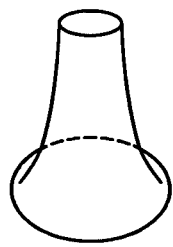
FIG. 4G is a schematic perspective view of a light transmitting wall of an optical adjustment layer of a display device according to an embodiment of the present invention.
Figure 4H:
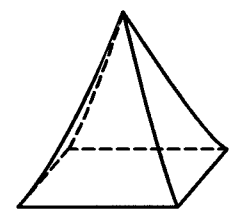
FIG. 4H is a schematic perspective view of a light transmitting wall of an optical adjustment layer of a display device according to an embodiment of the present invention.

In the light transmitting wall 152 shown in FIG. 4G, the generatrix on the side surface of the truncated cone is not a straight line but a curved line. Further, in the light transmitting wall 152 shown in FIG. 4H, the hypotenuse of the quadrangular pyramid is not a straight line but a curved line. As shown in FIGS. 4G and 4H, the side surface of the light transmitting wall 152 may be a curved surface instead of a flat surface. When the side surface of the light transmitting wall 152 is a curved surface, it is preferable that the side surface has a concave shape. When the side surface of the light transmitting wall 152 has a concave shape, it is possible to collect the reflected light in a specific direction.

Although examples of the shape of the light transmitting wall 152 that can be applied to the optical adjustment layer 136 of the display device 10 according to the present embodiment are shown with reference to FIGS. 4A to 4H, the shape of the light transmitting wall 152 is not limited to these. The optimum shape of the light transmitting wall 152 can be selected in consideration of the arrangement and the shape of the light emitting element 130.

Although the display device 10 according to the present embodiment is described above, the optical adjustment layer 136 of the display device 10 can be variously modified or adjusted. Therefore, some modifications are described below. Further, the modification is not limited to the following description.

Modification 1

A modification of the optical adjustment layer 136 of the display device 10 according to the present embodiment is described with reference to FIG. 5.

Figure 5:
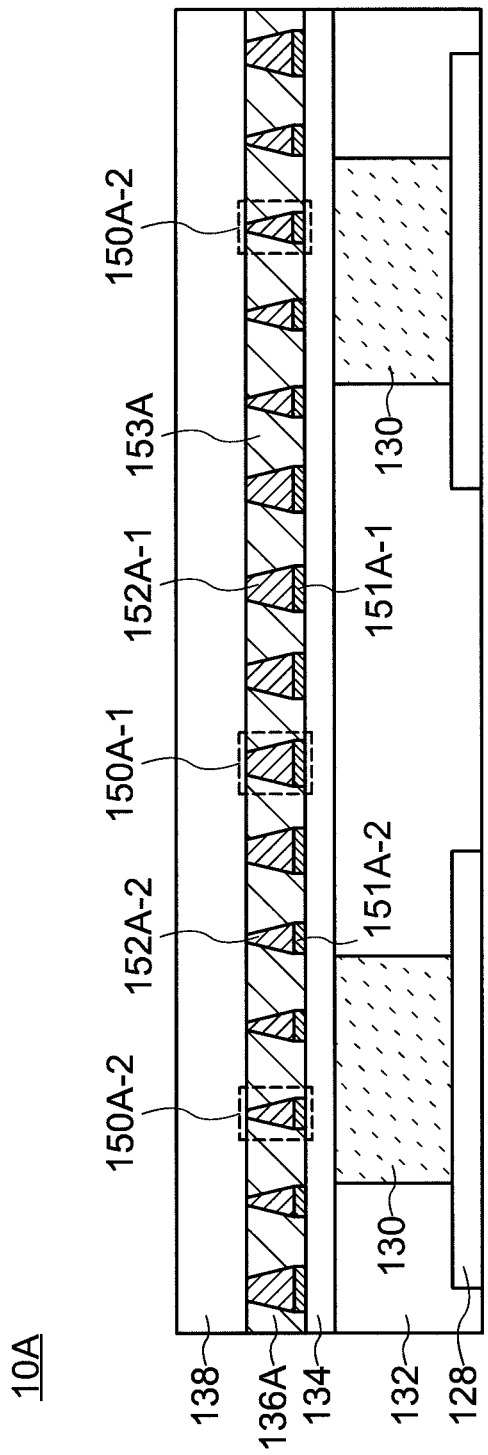
FIG. 5 is a schematic partial cross-sectional view of a display device according to an embodiment of the present invention.

FIG. 5 is a schematic partial cross-sectional view of a display device 10A according to the embodiment of the present invention. Specifically, FIG. 5 is a cross-sectional view of a portion of the display device 10A including the light emitting element 130 and an optical adjustment layer 136A. Hereinafter, the optical adjustment layer 136A is mainly described.

As shown in FIG. 5, the optical adjustment layer 136A includes a first structure 150A-1, a second structure 150A-2, and a light transmitting film 153A. The first structure 150A-1 includes a first reflective film 151A-1 and a first light transmitting wall 152A-1 on the first reflective film 151A-1. The second structure 150A-2 includes a second reflective film 151A-2 and a second light transmitting wall 152A-2 on the second reflective film 151A-2. The light transmitting film 153A is provided so as to surround a side surface of the first structure 150A-1 and a side surface of the second structure 150A-2. In other words, the light transmitting film 153A is provided so as to be in contact with a side surface of the first reflective film 151A-1, side surfaces of the first light transmitting wall 152A-1 and the second light transmitting wall 152A-2, and a side surface of the second reflective film 151A-2. Further, the refractive indexes of the first light transmitting wall 152A-1 and the second light transmitting wall 152A-2 are larger than the refractive index of the light transmitting film 153A.

In the optical adjustment layer 136A, the first structure 150A-1 is provided in a region that does not overlap the light emitting element 130. On the other hand, the second structure 150A-2 is provided in a region that overlaps the light emitting element 130.

The second structure 150A-2 is smaller than the first structure 150A-1. That is, the area of the upper surface or the lower surface of the second reflective film 151A-2 is smaller than the area of the upper surface or the lower surface of the first reflective film 151A-1. Therefore, when the first structure 150A-1 and the second structure 150A-2 are arranged at the same pitch, the transparent region between the second structures 150A-2 is larger than the transparent region between the first structures 150A-1. Therefore, when a large amount of light is emitted from the upper surface of the light emitting element 130, the area of the second reflective film 151A-2 of the second structure 150A-2 which overlaps the light emitting element 130 is reduced and the transmittance of the light emitted from the upper surface of the light emitting element 130 can be increased. Further, the first light transmitting wall 152A-1 of the first structure 150A-1 and the second light transmitting wall 152A-2 of the second structure 150A-2 may have different shapes.

As described above, in the present embodiment, the size of the structure of the optical adjustment layer 136A can be changed depending on the distance from the light emitting element 130, as in the Modification 1.

Modification 2

A modification of the optical adjustment layer 136 of the display device 10 according to the present embodiment is described with reference to FIG. 6.

Figure 6:
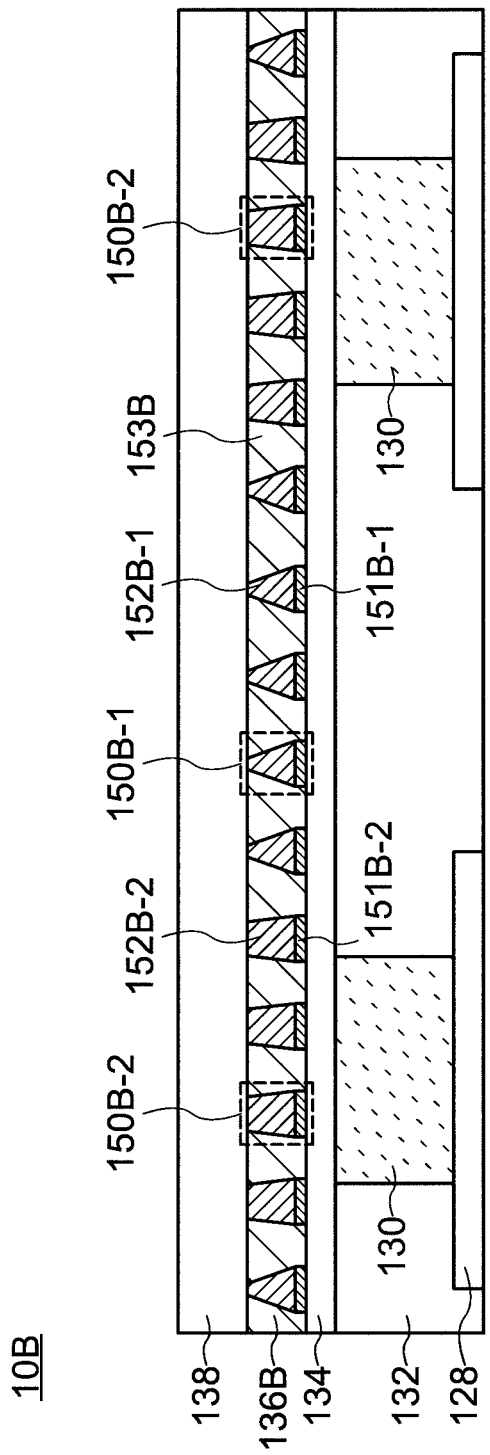
FIG. 6 is a schematic partial cross-sectional view of a display device according to an embodiment of the present invention.

FIG. 6 is a schematic partial cross-sectional view of a display device 10B according to the embodiment of the present invention. Specifically, FIG. 6 is a cross-sectional view of a portion of the display device 10B including the light emitting element 130 and an optical adjustment layer 136B. Hereinafter, the optical adjustment layer 136B is mainly described.

As shown in FIG. 6, the optical adjustment layer 136B includes a first structure 150B-1, a second structure 150B-2, and a light transmitting film 153B. The first structure 150B-1 includes a first reflective film 151B-1 and a first light transmitting wall 152B-1 on the first reflective film 151B-1. The second structure 150B-2 includes a second reflective film 151B-2 and a second light transmitting wall 152B-2 on the second reflective film 151B-2. The light transmitting film 153B is provided so as to surround a side surface of the first structure 150B-1 and a side surface of the second structure 150B-2. In other words, the light transmitting film 153B is provided so as to be in contact with a side surface of the first reflective film 151B-1, side surfaces of the first light transmitting wall 152B-1 and the second light transmitting wall 152B-2, and a side surface of the second reflective film 151B-2. Further, the refractive indexes of the first light transmitting wall 152B-1 and the second light transmitting wall 152B-2 are larger than the refractive index of the light transmitting film 153B.

In the optical adjustment layer 136A, the first structure 150B-1 is provided in a region that does not overlap the light emitting element 130. On the other hand, the second structure 150B-2 is provided in a region that overlaps the light emitting element 130.

A taper angle of the second light transmitting wall 152B-2 of the second structure 150B-2 is larger than a taper angle of the first light transmitting wall 152B-1 of the first structure 150B-1. That is, the inclination of the side surface of the second light transmitting wall 152B-2 is closer to being perpendicular to the upper surface of the light emitting element 130 than the inclination of the side surface of the first light transmitting wall 152B-1.

Since the light emitted from the upper surface of the light emitting element 130 travels toward the display surface side of the display device 10B, the direction of the light may be slightly adjusted. Therefore, the taper angle of the second light transmitting wall 152B-2 is increased so that the light emitted from the upper surface of the light emitting element 130 is reflected so as to travel toward the display surface side of the display device 10B.

On the other hand, in a structure located at a position away from the light emitting element 130, it is necessary to reflect the light emitted from the side surface of the light emitting element 130 toward the display surface side of the display device 10B. Therefore, the taper angle of the first light transmitting wall 152B-1 is reduced so that the light emitted from the side surface of the light emitting element 130 is reflected so as to travel toward the display surface side of the display device 10B.

As described above, in the present embodiment, the taper angle of the light transmitting wall of the structure of the optical adjustment layer 136B can be changed depending on the distance from the light emitting element 130, as in the second modification.

Modification 3

A modification of the optical adjustment layer 136 of the display device 10 according to the present embodiment is described with reference to FIG. 7.

Figure 7:
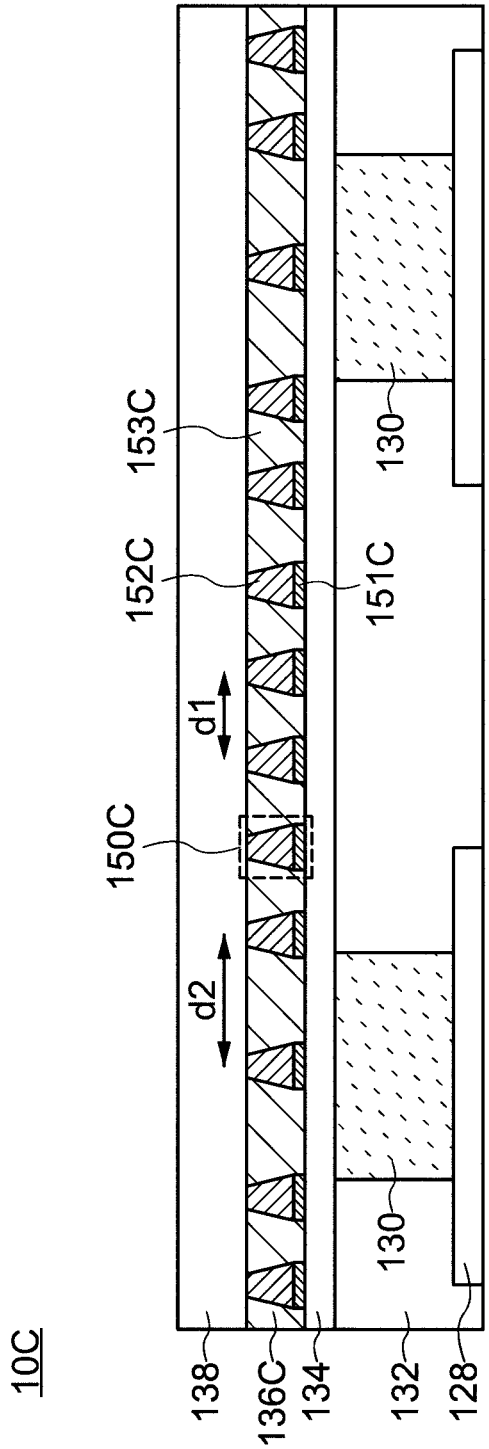
FIG. 7 is a schematic partial cross-sectional view of a display device according to an embodiment of the present invention.

FIG. 7 is a schematic partial cross-sectional view of a display device 10C according to the embodiment of the present invention. Specifically, FIG. 7 is a cross-sectional view of a portion of the display device 100 including the light emitting element 130 and an optical adjustment layer 136C. Hereinafter, the optical adjustment layer 136C is mainly described.

As shown in FIG. 7, the optical adjustment layer 136C includes a structure 150C and a light transmitting film 153C. The structure 150C includes a reflective film 151C and a light-transmitting wall 152C on the reflective film 151C. The light transmitting film 153C is provided so as to surround a side surface of the structure 150C. In other words, the light transmitting film 153C is provided so as to be in contact with a side surface of the reflective film 151C and a side surface of the light transmitting wall 152C. Further, the refractive index of the light transmitting wall 152C is larger than the refractive index of the light transmitting film 153C.

In a region where the structure 150C does not overlap the light emitting element 130, the structure 150C is arranged at a pitch d1 between the structures 150C. On the other hand, in a region where the structure 150C overlaps the light emitting element 130, the structure 150C is arranged at a pitch d2 between the structures 150C. That is, in the optical adjustment layer 136C, the pitches between the structures 150C are different. Since the light emitted from the upper surface of the light emitting element 130 travels toward the display surface side of the display device 100, it is not necessary to adjust the direction of the light. Therefore, the pitch between the structures 150C which overlaps the light emitting element 130 is larger than the pitch between the structures 150C which does not overlap the light emitting element 130 (d2>d1). As a result, the transmittance of the light emitted from the upper surface of the light emitting element 130 can be increased. Further, a configuration that is not provided with the structure 150C in the region which overlaps the light emitting element 130 can also be used.

As described above, in the present embodiment, the pitch between the structures of the optical adjustment layer 136C can be changed depending on the distance from the light emitting element 130, as in the modification 3.

Second Embodiment

A display device 20 according to an embodiment of the present invention is described with reference to FIGS. 8 to 10.

[Overall Configuration of Display Device 20]

Figure 8:
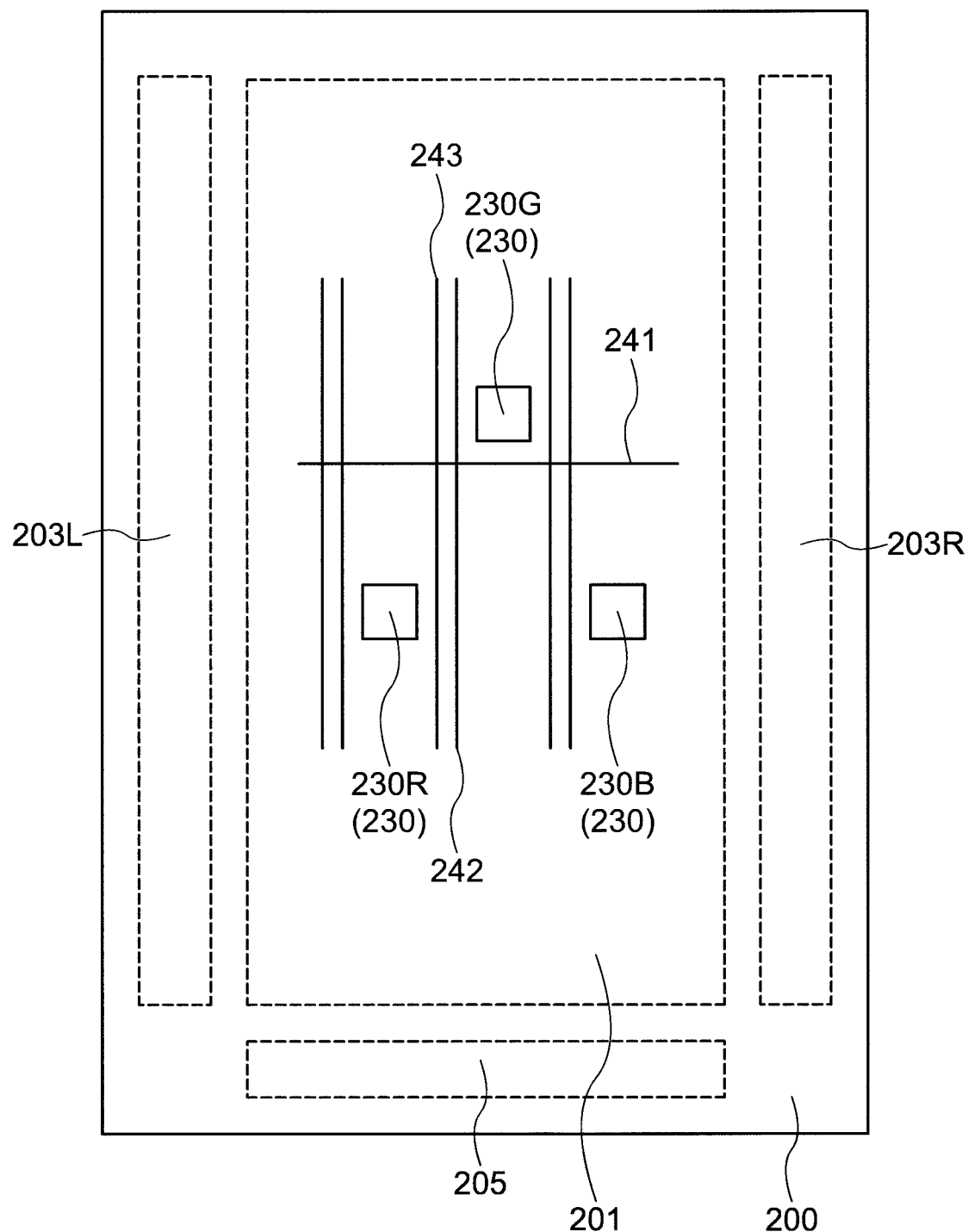
FIG. 8 is a block diagram showing a layout configuration of a circuit substrate used in a display device according to an embodiment of the present invention.

FIG. 8 is a block diagram showing a layout configuration of a circuit substrate 21 used in the display device 20 according to the embodiment of the present invention.

As shown in FIG. 8, the circuit substrate 21 includes a display portion 201, a first circuit portion 203L, a second circuit portion 203R, and a connection portion 205 on the substrate 200. The display portion 201 is provided in the central portion of the substrate 200, and the first circuit portion 203L, the second circuit portion 203R, and the connection portion 205 are provided in the peripheral portion of the substrate 200 (around the display portion 201).

The substrate 200 corresponds to the substrate 100 described in the First Embodiment. Therefore, the same substrate as the substrate 100 can be used as the substrate 200.

The display portion 201 includes a plurality of pixels. A part of the pixels is illustrated in the display portion 201 of FIG. 8. Each pixel is provided with a light emitting element 230 and a transistor (not shown) for controlling the light emitting element 230. Further, a scanning wiring 241, a signal wiring 242, and a current supply wiring 243 are connected to each pixel to control the light emitting element 230. For example, the scanning wiring 241 may be provided between adjacent pixels, and the signal wiring 242 and the current supply wiring 243 may be provided so as to intersect the scanning wiring 241. The details of a drive circuit of the pixel having the light emitting element 230 are described later.

The light emitting element 230 shown in FIG. 8 includes any one of a red light emitting element 230R, a green light emitting element 230G, and a blue light emitting element 230B. By combining the red light emission of the red light emitting element 230R, the green light emission of the green light emitting element 230G, and the blue light emission of the blue light emitting element 230B, the display device 20 for full-color display is obtained. Further, the display device 20 for full-color display is also possible by arranging a white light emitting element in each pixel and extracting red light emission, green light emission, and blue light emission from the white light of the white light emitting element via a color filter. Furthermore, the display device 20 for full-color display is also possible by arranging an ultraviolet light emitting element in each pixel, converting ultraviolet light of the ultraviolet light emitting element via a red phosphor, a green phosphor, and a blue phosphor and extracting red light emission, green light emission, and blue light emission.

The light emitting elements 230 can be arranged not only in a zigzag shape shown in FIG. 8 but also in a matrix shape or a stripe shape.

The first circuit portion 203L and the second circuit portion 203R include a drive circuit for driving the transistor included in the pixel. For example, the drive circuit is a scanning line drive circuit (a gate driver circuit), a signal line drive circuit (a source driver circuit), or the like. In FIG. 8, although two circuit portions of the first circuit portion 203L and the second circuit portion 203R are provided, the number of circuit portions may be one or three or more.

The connection portion 205 is connected to the first circuit portion 203L and the second circuit portion 203R by a connection wiring (not shown). Further, the connection portion 205 is connected to an external device by a flexible printed circuit substrate (FPC) or the like. That is, a signal from the external device is input to the first circuit portion 203L and the second circuit portion 203R via the connection portion 205, and controls the transistor of the pixel of the display portion 201.

[Drive Circuit of Light Emitting Element 230]

Figure 9:
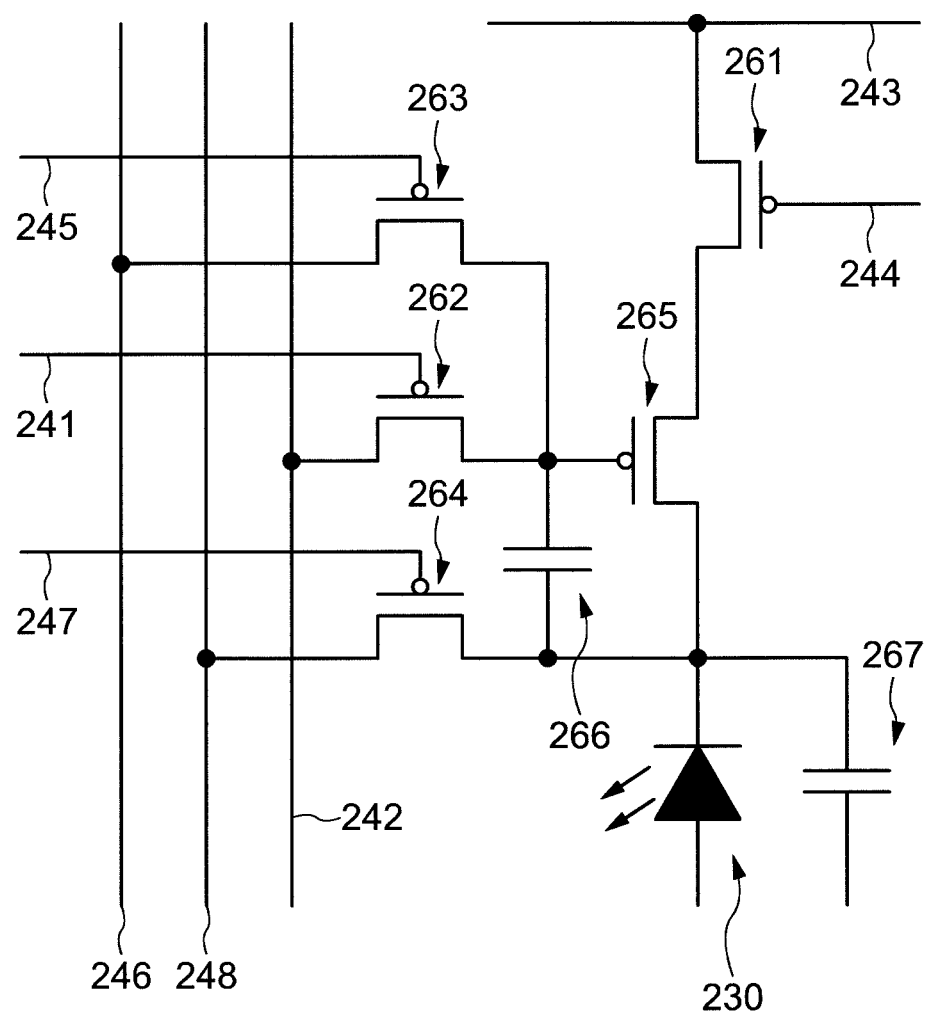
FIG. 9 is an equivalent circuit of one pixel of a display device according to an embodiment of the present invention.

FIG. 9 is an equivalent circuit of one pixel of the display device 20 according to the embodiment of the present invention. The pixel includes the light emitting element 230, a first transistor 261 and a second transistor 262, a third transistor 263, a fourth transistor 264, a fifth transistor 265, a first capacitance 266, and a second capacitance 267. Further, the pixel also includes a scanning wiring 241, a signal wiring 242, a current supply wiring 243, a light emission control scanning wiring 244, an initialization scanning wiring 245, an initialization wiring 246, a reset scanning wiring 247, and a reset wiring 248.

The first transistor 261 is a light emission control transistor. The first transistor 261 is opened and closed by the light emitting control scanning wiring 244, and selects whether or not to pass a current to the light emitting element 230 and the fifth transistor 265.

The second transistor 262 is a selection transistor. The second transistor 262 is opened and closed by the scanning wiring 241 and inputs a voltage supplied from the signal wiring 242 to a gate of the fifth transistor 265.

The third transistor 263 is an initialization transistor. The third transistor 263 is opened and closed by the initialization scanning wiring 245, and fixes a predetermined voltage to the gate of the fifth transistor 265 by using a voltage supplied from the initialization wiring 246.

The fourth transistor 264 is a reset transistor. The fourth transistor 264 is opened and closed by the reset scanning wiring 247, and applies a reverse bias voltage supplied from the reset wiring 248 to the light emitting element 230.

The fifth transistor 265 is a drive transistor. As described above, in the fifth transistor 265, the voltage of the gate is determined based on the operation of the second transistor 262 or the third transistor 263, and the current of the value determined based on the voltage of the gate is supplied from the current supply wiring 243 to the light emitting element 230.

[Configuration of Optical Adjustment Layer 236]

An optical adjustment layer 236 of the display device 20 according to the embodiment of the present invention is described with reference to FIG. 10.

Figure 10:
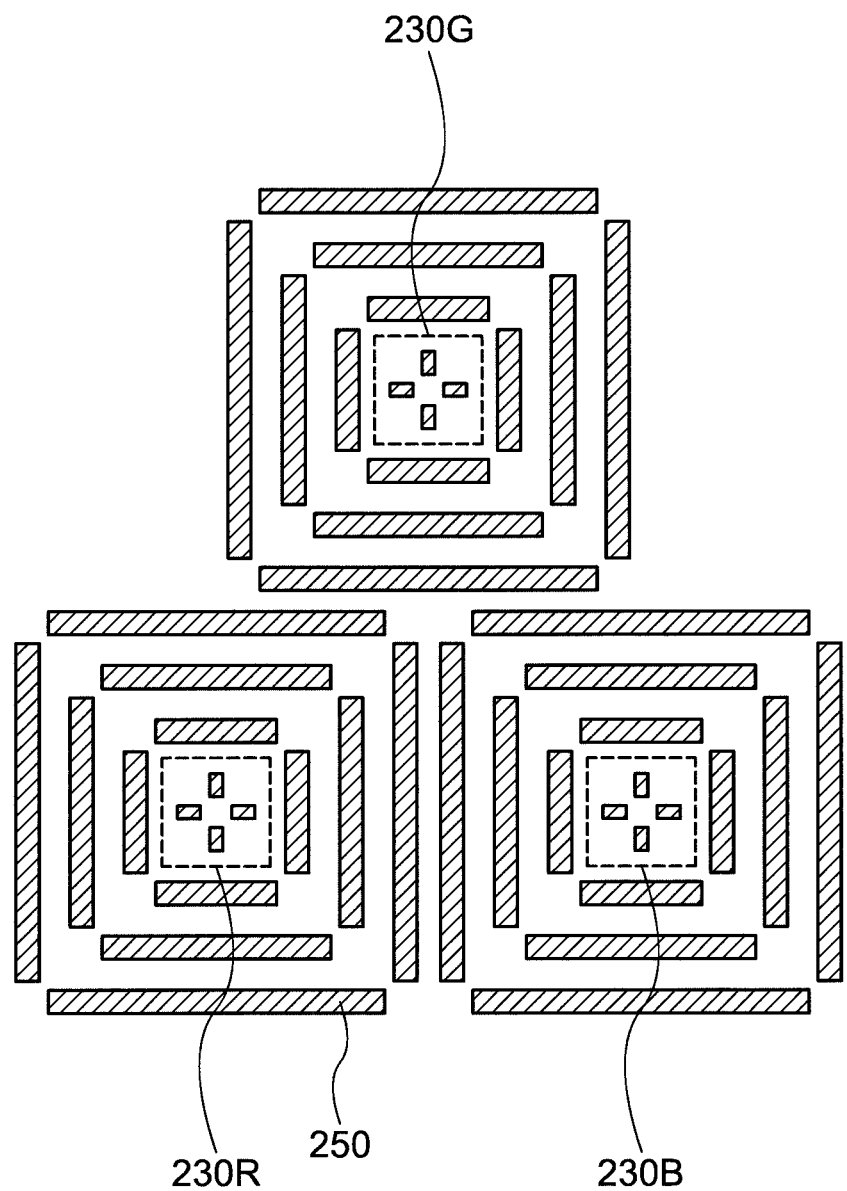
FIG. 10 is a schematic top view of a structure of an optical adjustment layer of a display device according to an embodiment of the present invention.

FIG. 10 is a schematic top view of a structure 250 of the optical adjustment layer 236 of the display device 20 according to the embodiment of the present invention. Specifically, FIG. 10 shows a top view of the structure of the optical adjustment layer 236 provided on three pixels (Each of the pixels includes one of a red light emitting element 230R, a green light emitting element 230G, or a blue light emitting element 230B. Further, when the colors are not distinguished, it is simply described as a light emitting element 230). The structure 250 includes a reflective film 251 and a light-transmitting wall 252 on the reflective film 251. Further, although a light transmitting film 253 is arranged between the structures 250, in FIG. 10, the light transmitting film 253 is omitted in order to make the drawing easier to see. Furthermore, a refractive index of the light transmitting wall 252 is larger than a refractive index of the light transmitting film 253.

As shown in FIG. 10, in a region that does not overlap the light emitting element 230, the structure 250 is arranged so as to surround the light emitting element 230 provided in each pixel. That is, the structure 250 is provided so as to extend along the direction of the side surface of the light emitting element 230. Further, the plurality of structures 250 are arranged so as to surround the light emitting element 230 not only in a single layer but also in a double or triple layer. Therefore, the length of the structure 250 in the direction along the side surface of the light emitting element 230 increases as the distance from the light emitting element 230 increases. In FIG. 10, although the structure 250 is provided linearly along the side surface direction of the light emitting element 230 and is not in contact with the intersecting structure 250, the structure 250 and the intersecting structure 250 can be in contact with each other. That is, it is also possible to connect ends of the linear structure 250 to form a pattern similar to a rectangular frame.

By arranging the structure 250 so as to surround the light emitting element 230 provided in the pixel, the light emitted from the side surface of the light emitting element 230 is repeatedly reflected by the structure 250 provided in the pixel so that it is easy to collect light in the pixel. That is, since light can be confined in the pixels including each of the red light emitting element 230R, the green light emitting element 230G, and the blue light emitting element 230B, light leakage between the pixels can be suppressed.

Although the display device 20 according to the present embodiment is described above, the optical adjustment layer 136 of the display device 10 can be variously modified or adjusted. Therefore, a number of modifications are described below. Further, the modification is not limited to the following description.

Modification 1

A modification of the optical adjustment layer 236 of the display device 20 according to the present embodiment is described with reference to FIG. 11.

Figure 11:
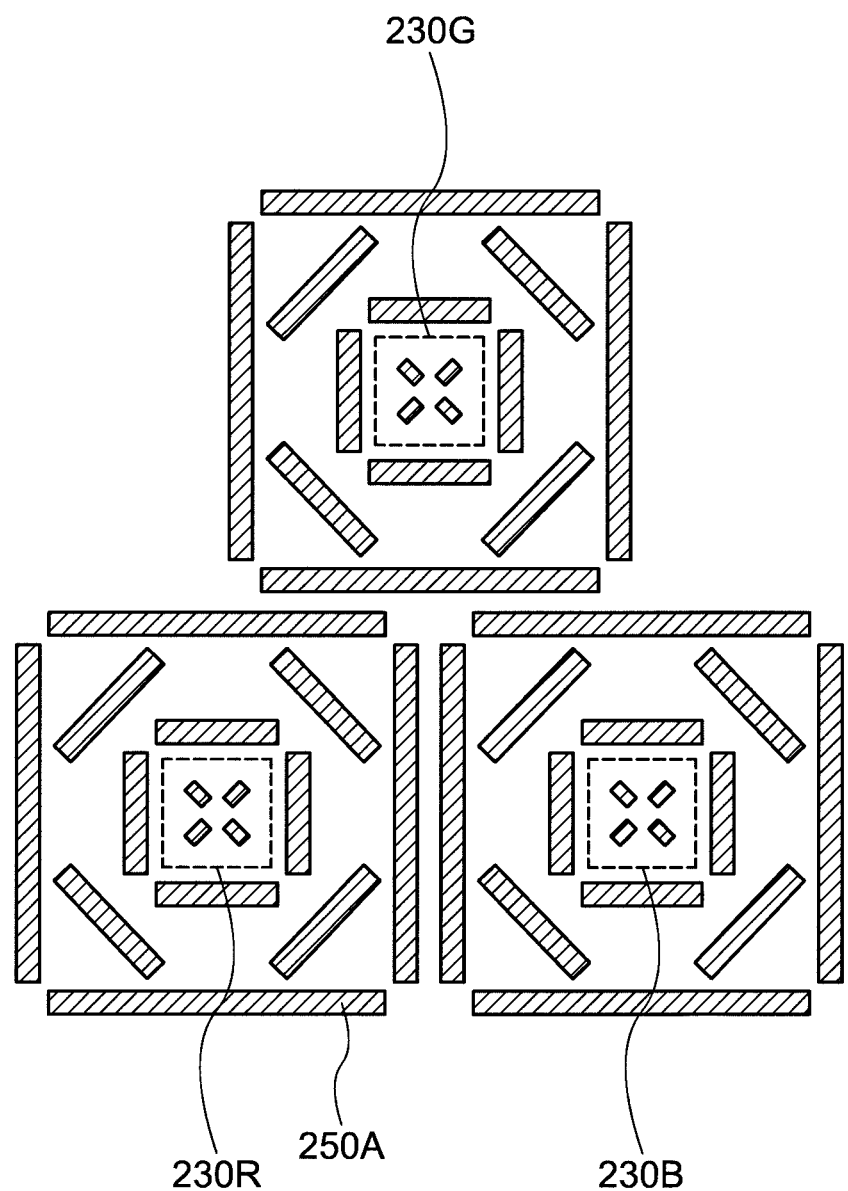
FIG. 11 is a schematic top view of a structure of an optical adjustment layer of a display device according to an embodiment of the present invention.

FIG. 11 is a schematic top view of a structure 250A of an optical adjustment layer 236A of a display device 20B according to the embodiment of the present invention. Specifically, FIG. 11 shows a top view of the structure 250A of the optical adjustment layer 236A provided on three pixels (the red light emitting element 230R, the green light emitting element 230G, and the blue light emitting element 230B). The structure 250A includes a reflective film 251A and a light transmitting wall 252A on the reflective film 251A. Further, although a light transmitting film 253A is arranged between the structures 250A, in FIG. 11, the light transmitting film 253A is omitted in order to make the drawing easier to see. Furthermore, a refractive index of the light transmitting wall 252A is larger than a refractive index of the light transmitting film 253A.

As shown in FIG. 11, in a region that does not overlap the light emitting element 230, the structure 250A closest to the light emitting element 230 is arranged so as to surround the light emitting element 230 provided in each pixel. That is, the structure 250A is provided so as to extend along the direction of the side surface of the light emitting element 230. The structure 250A second closest to the light emitting element 230 is arranged in a state rotated by 45 degrees. Although the plurality of structures 250A are arranged not only in a single layer but also in a double or triple layer so as to surround the light emitting element 230, the plurality of the structures 250A are arranged in a state alternately rotated by 45 degrees as the distance from the light emitting element 230 increases. Further, the length of the structure 250A in the direction along the side surface of the light emitting element 230 increases as the distance from the light emitting element 230 increases. In FIG. 11, although the structure 250A is provided linearly along the side surface direction of the light emitting element 230 and is not in contact with the intersecting structures 250A, the structure 250A and the intersecting structure 250A can be in contact with each other. That is, it is also possible to connect ends of the linear structure 250A to form a pattern similar to a rectangular frame.

By arranging the structure 250A so as to surround the light emitting element 230 provided in the pixel, the light emitted from the side surface of the light emitting element 230 is repeatedly reflected by the structure 250A provided in the pixel so that it is easy to collect light in the pixel. That is, since light can be confined in the pixels including each of the red light emitting element 230R, the green light emitting element 230G, and the blue light emitting element 230B, light leakage between the pixels can be suppressed.

Modification 2

A modification of the optical adjustment layer 236 of the display device 20 according to the present embodiment is described with reference to FIG. 12.

Figure 12:
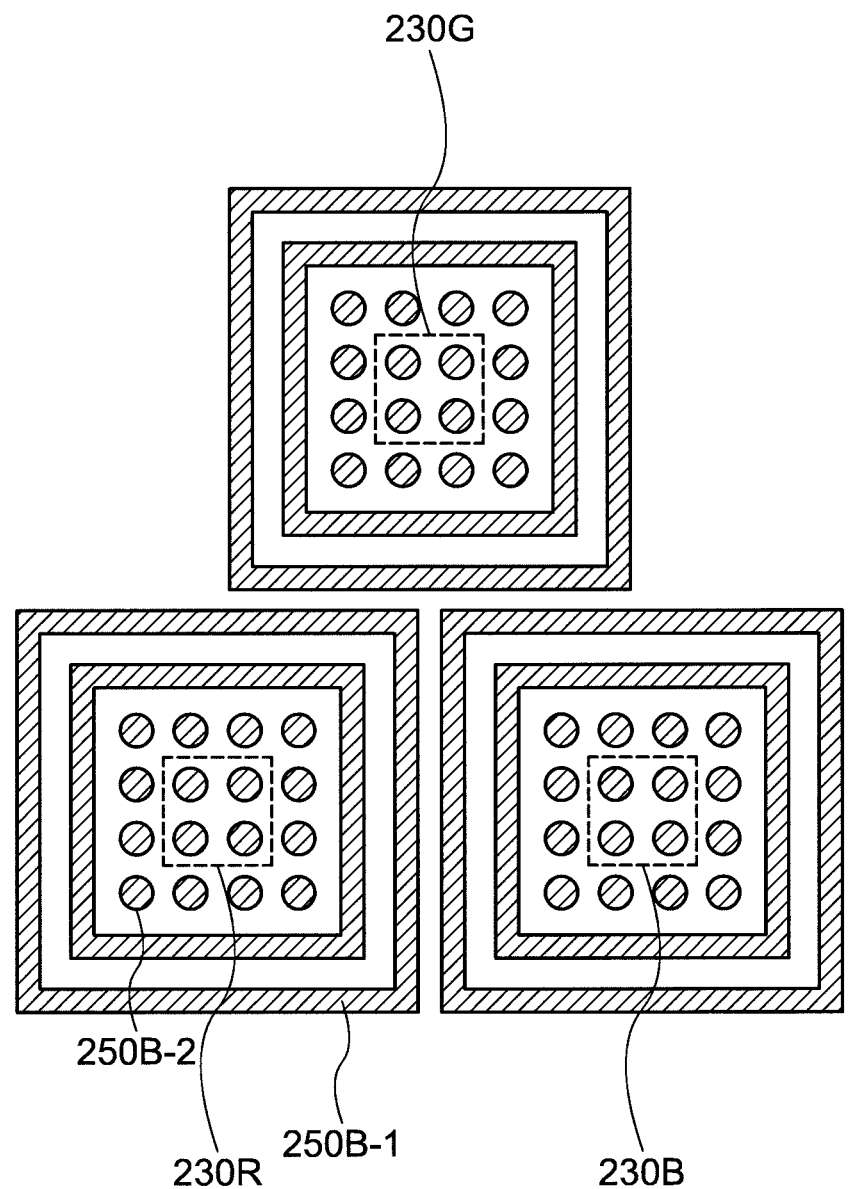
FIG. 12 is a schematic top view of a structure of an optical adjustment layer of a display device according to an embodiment of the present invention.

FIG. 12 is a schematic top view of a structure 250B of an optical adjustment layer 236B of a display device 20B according to the embodiment of the present invention. Specifically, FIG. 12 shows a top view of a first structure 250B-1 and a second structure 250B-2 of the optical adjustment layer 236B provided on three pixels (the red light emitting element 230R, the green light emitting element 230G, and the blue light emitting element 230B). The first structure 250B-1 includes a first reflective film 251B-1 and a first light transmitting wall 252B-1 on the first reflective film 251B-1. The second structure 250B-2 includes a second reflective film 251B-2 and a second light transmitting wall 252B-2 on the second reflective film 251B-2. Further, although a light transmitting film 253B is arranged between the first structures 250B-1, between the second structures 250B-2, and between the first structure 250B-1 and the second structure 250B-2, in FIG. 12, the light transmitting film 253B is omitted in order to make the drawing easier to see. Furthermore, a refractive index of the first light transmitting wall 252B-1 and a refractive index of the second light transmitting wall 252B-2 are larger than a refractive index of the light transmitting film 253B.

As shown in FIG. 12, the first structure 250B-1 has a pattern similar to a rectangular frame and is provided in a region that does not overlap the light emitting element 230. On the other hand, the second structure 250B-2 has a structure with a truncated cone or a cone, and is provided on and near the light emitting element 230. That is, the first structure 250B-1 is provided so as to surround the second structure 250B-2. Further, the pattern of the first structure 250B-1 is not limited to a rectangle. The first structure 250B-1 can also be provided in a repeating pattern of polygons such as triangles or hexagons, or concentric circles.

The light emitted from the upper surface and the vicinity of the light emitting element 230 spreads in all directions toward the display surface of the display device, and is reflected as uniformly as possible by the second structure 250B-2. On the other hand, the direction of the light emitted from the side surface of the light emitting element 230 is adjusted toward the display surface of the display device by the first structure 250B-1. By arranging the first structure 250B-1 so as to surround the light emitting element 230 provided in the pixel, the light emitted from the side surface of the light emitting element 230 is repeatedly reflected by the first structure 250B-1 and the second structure 250B-2 provided in the pixel so that it is easy to collect light in the pixel. That is, since light can be confined in the pixels including each of the red light emitting element 230R, the green light emitting element 230G, and the blue light emitting element 230B, light leakage between the pixels can be suppressed.

Modification 3

A modification of the optical adjustment layer 236 of the display device 20 according to the present embodiment is described with reference to FIG. 13.

Figure 13:
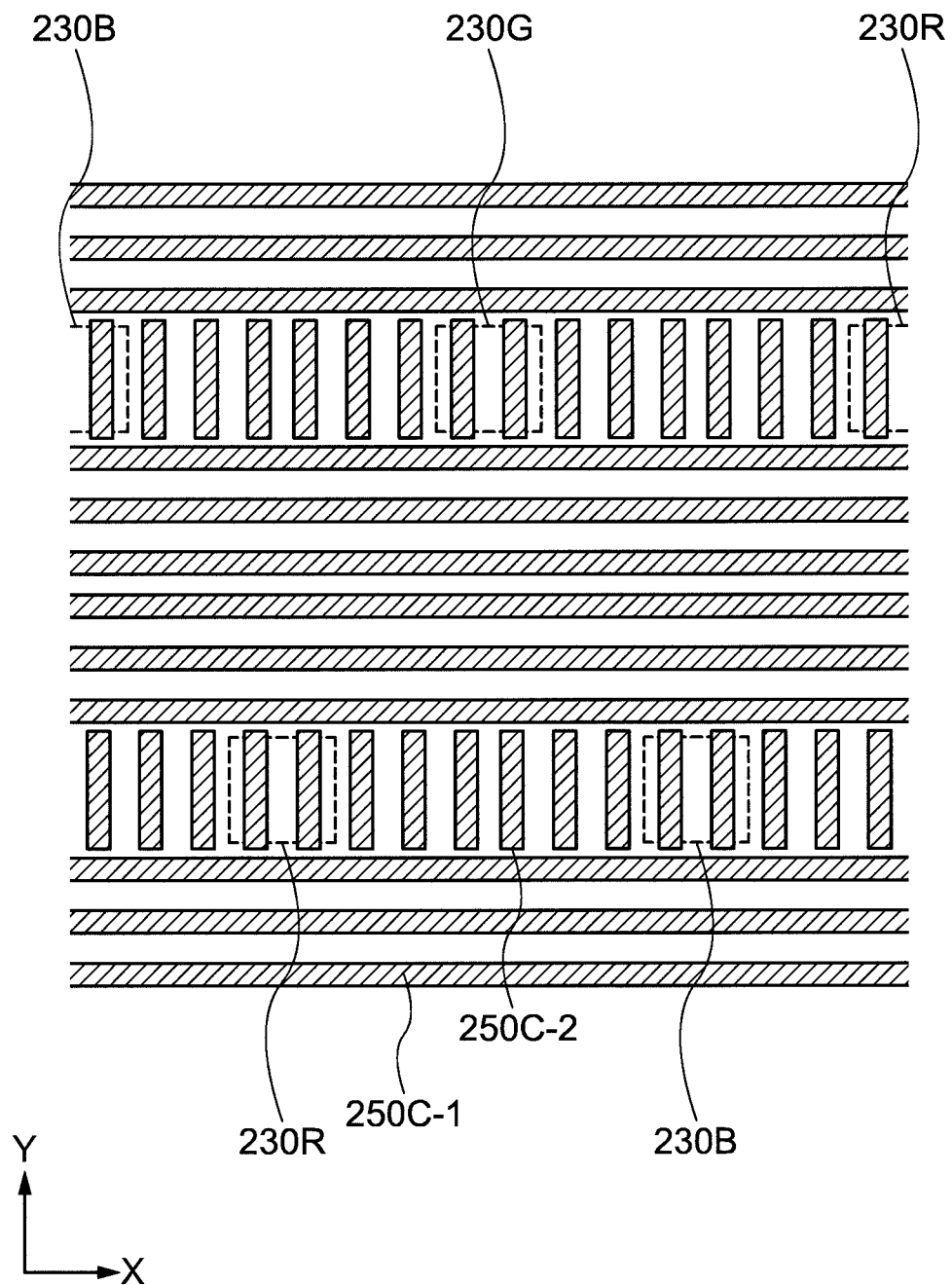
FIG. 13 is a schematic top view of a structure of an optical adjustment layer of a display device according to an embodiment of the present invention.

FIG. 13 is a schematic top view of a structure 250C of an optical adjustment layer 236C of a display device 20C according to the embodiment of the present invention. Specifically, FIG. 13 shows a part of the pixels arranged periodically, and a view of the first structure 250C-1 and the second structure 250C-2 of the optical adjustment layer 236C provided over the light emitting element 230. In one direction (X direction in FIG. 13), a pixel provided with the blue light emitting element 230B, a pixel provided with the green light emitting element 230G, and a pixel provided with the red light emitting element 230R are repeatedly arranged.

The first structure 250C-1 is provided in a region that does not overlap the light emitting element 230, and is provided so as to extend in one direction. The first structure 250C-1 may be continuously provided from one end of the display portion to the other end of the display portion. On the other hand, the second structure 250C-2 has a rectangular structure and is provided in a region that overlaps the light emitting element 230 between the first structures 250C-1. The first structure 250C-1 includes a first reflective film 251C-1 and a first light transmitting wall 252C-1 on the first reflective film 251C-1. The second structure 250C-2 includes a second reflective film 251C-2 and a second light transmitting wall 252C-2 on the second reflective film 251C-2. Further, although a light transmitting film 253C is arranged between the first structures 250C-1, between the second structures 250C-2, and between the first structure 250C-1 and the second structure 250C-2, in FIG. 13, the light transmitting film 253C is omitted in order to make the drawing easier to see. Further, a refractive index of the first light transmitting wall 252C-1 and a refractive index of the second light transmitting wall 252C-2 are larger than a refractive index of the light transmitting film 253C.

Since the first structure 250C-1 and the second structure 250C-2 are arranged so as to surround the light emitting element 230 provided in the pixel, the light emitted from the side surface of the light emitting element is repeatedly reflected by the first structure 250C-1 and the second structure 250C-2 provided in the pixel so that it is easy to collect light in the pixel. That is, since light can be confined in the pixels including each of the red light emitting element 230R, the green light emitting element 230G, and the blue light emitting element 230B, light leakage between the pixels can be suppressed.

Third Embodiment

A display device 30 according to an embodiment of the present invention is described with reference to FIG. 14.

Figure 14:
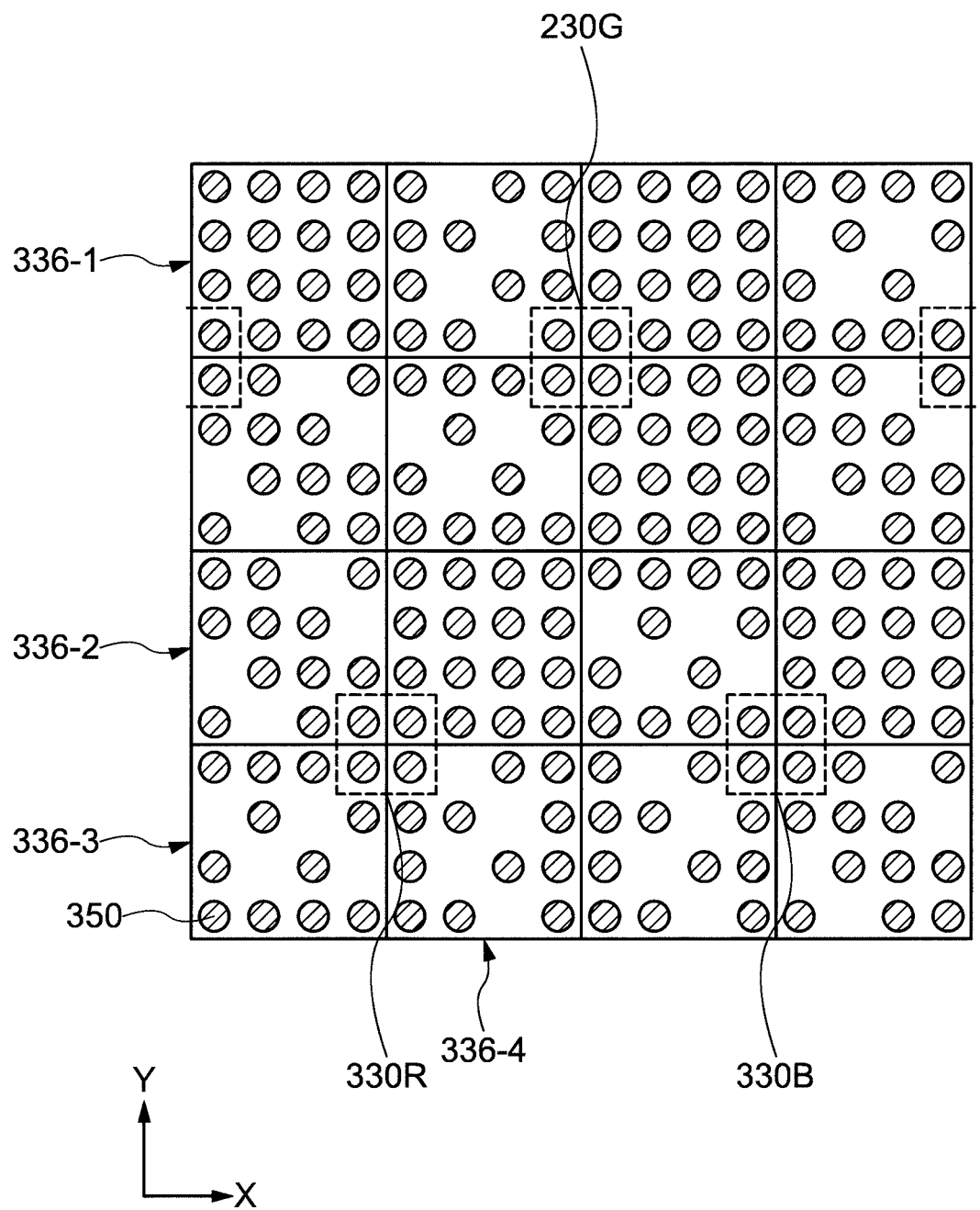
FIG. 14 is a schematic top view of a structure of an optical adjustment layer of a display device according to an embodiment of the present invention.

FIG. 14 is a schematic top view of a structure 350 of an optical adjustment layer 336 of the display device 30 according to the embodiment of the present invention. Specifically, FIG. 14 shows a part of the pixels arranged periodically, and shows a top view of the structure 350 of the optical adjustment layer 336 provided over the light emitting element 330. In one direction (X direction in FIG. 14), the pixel provided with the blue light emitting element 230B, the pixel provided with the green light emitting element 230G, and the pixel provided with the red light emitting element 230R are repeatedly arranged.

The structure 350 has a structure with a truncated cone or a cone and includes a light transmitting wall 352 on a reflective film 351. Although the structure 350 appears to be randomly arranged, the optical adjustment layer 336 is formed by a combination of four arrangement patterns. The first arrangement pattern 336-1 is a pattern in which 16 structures 350 are arranged in a matrix. The second arrangement pattern 336-2, the third arrangement pattern 336-3, and the fourth arrangement pattern 336-4 are patterns in which 12 structures 350 are arranged. In the second arrangement pattern 336-2 to the fourth arrangement pattern 336-4, although four structures are removed from the 16 structures 350 arranged in a matrix, positions of the removed structures are different in each arrangement pattern. The optical adjustment layer 336 is formed by randomly arranging the first arrangement pattern 336-1 to the fourth arrangement pattern 336-4.

Since the display device 30 is provided with the optical adjustment layer 336, the light emitted from the side surface of the light emitting element 330 can be used. Therefore, the display device 30 has high luminous efficiency. Further, since the reflective film 351 of the structure 350 reflects the incident external light without changing the phase, the reflected external light is absorbed by the polarizing layer. Therefore, the display device 30 can display with high contrast even under external light. Further, since the structures 350 are randomly arranged, the display device 30 can display with suppressed interference fringes such as moire.

Fourth Embodiment

A display device 40 according to an embodiment of the present invention is described with reference to FIG. 15.

Figure 15:
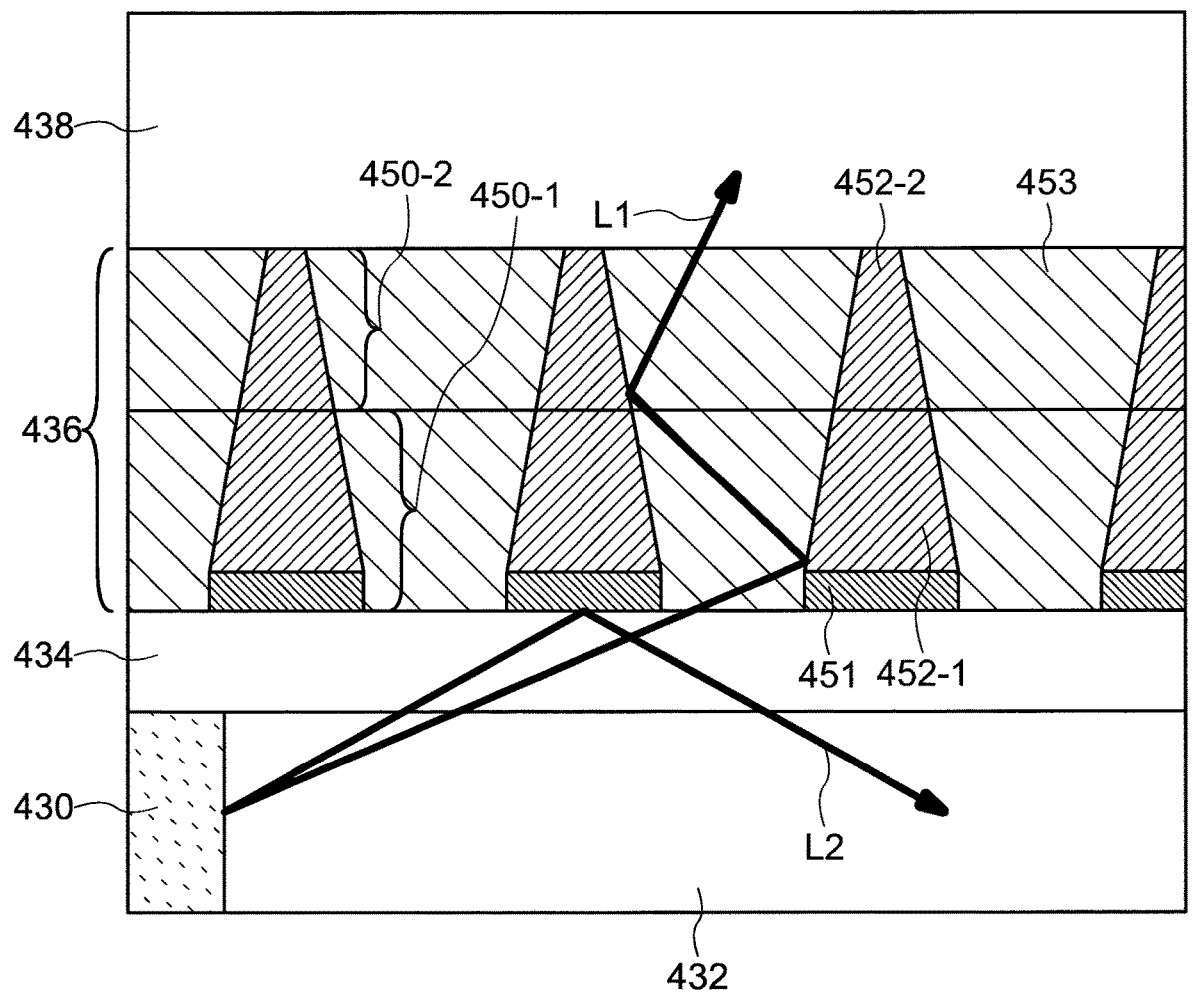
FIG. 15 is a schematic cross-sectional view of a region including an optical adjustment layer of a display device according to an embodiment of the invention.

FIG. 15 is a schematic cross-sectional view of a region including an optical adjustment layer 436 of the display device 40 according to the embodiment of the present invention. Specifically, FIG. 15 is an enlarged cross-sectional view of a region corresponding to the region surrounded by the broken line shown in FIG. 1 in the display device 40.

As shown in FIG. 15, the optical adjustment layer 436 includes a lower structure 450-1, an upper structure 450-2, and a light transmitting film 453. The lower structure 450-1 includes a reflective film 451 and a first light transmitting wall 452-1 on the reflective film 451. The upper structure 450-2 includes a second light transmitting wall 452-2. The upper structure 450-2 is provided on the lower structure 450-1. The light transmitting film 453 is provided so as to surround a side surface of the lower structure 450-1 and a side surface of the upper structure 450-2. In other words, the light transmitting film 453 is provided so as to be in contact with a side surface of the reflective film 451, a side surface of the first light transmitting wall 452-1 and a side surface of the second light transmitting wall 452-2.

The side surface of the first light transmitting wall 452-1 and the side surface of the second light transmitting wall 452-2 have a taper. A taper angle of the side surface of the first light transmitting wall 452-1 and the side surface of the second light transmitting wall 452-2 are the same. The first light transmitting wall 452-1 and the second light transmitting wall 452-2 may include the same material or may include different materials. However, a refractive index of the first light transmitting wall 452-1 and a refractive index of the second light transmitting wall 452-2 are larger than a refractive index of the light transmitting film 453.

As described above, the refractive index of the first light transmitting wall 452-1 and the refractive index of the second light transmitting wall 452-2 are larger than the refractive index of the light transmitting film 453. Therefore, the light L1 emitted from the side surface of the light emitting element 430 is reflected at the interface between the first light transmitting wall 452-1 and the light transmitting film 453. Further, the reflected light is reflected at the interface between the second light transmitting wall 452-2 and the light transmitting film 453. That is, the light L1 which travels through the light transmitting film 453 is reflected by the side surface of the first light transmitting wall 452-1 and the second light transmitting wall 452-2, and is extracted from an upper surface of the light transmitting film 453. Therefore, the light emitted from the side surface of the light emitting element 430 is adjusted by the optical adjustment layer 436 so as to be extracted from the upper surface of the light emitting element 430.

In the optical adjustment layer 436 of the display device 40 according to the present embodiment, the number of times of light is reflected in the optical adjustment layer 436 can be increased by forming the light-transmitting wall into two layers. Therefore, the light emitted from the side surface of the light emitting element 430 can be further collected toward the upper surface of the light emitting element.

Although the display device 40 according to the present embodiment is described above, the optical adjustment layer 436 of the display device 40 can be variously modified or adjusted. Therefore, a number of modifications are described below. Further, the modification is not limited to the following description.

Modification 1

A modification of the optical adjustment layer 436 of the display device 40 according to the present embodiment is described with reference to FIG. 16.

Figure 16:
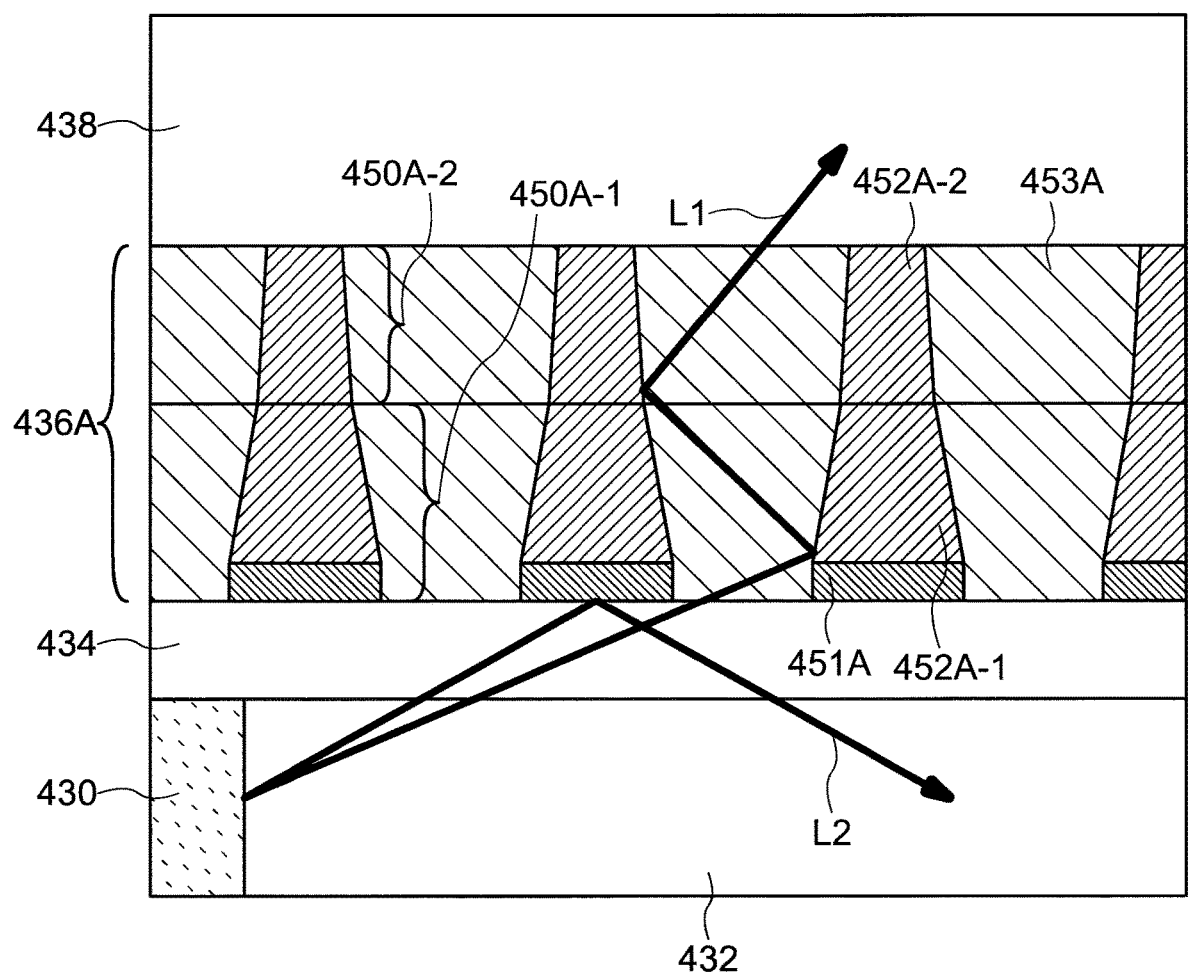
FIG. 16 is a schematic partial cross-sectional view of a display device according to an embodiment of the present invention.

FIG. 16 is a schematic partial cross-sectional view of a display device 40A according to the embodiment of the present invention. Specifically, FIG. 16 is a cross-sectional view of a portion of the display device 40A including a light emitting element 430 and an optical adjustment layer 436A. Hereinafter, the optical adjustment layer 436A is mainly described.

As shown in FIG. 16, the optical adjustment layer 436A includes a lower structure 450A-1, an upper structure 450A-2, and a light transmitting film 453A. The lower structure 450A-1 includes a reflective film 451A and a first light transmitting wall 452A-1 on the reflective film 451A. The upper structure 450A-2 includes a second light transmitting wall 452A-2. The upper structure 450A-2 is provided on the lower structure 450A-1. A light transmitting film 453A is provided so as to surround a side surface of the lower structure 450A-1 and a side surface of the upper structure 450A-2. In other words, the light transmitting film 453A is provided so as to be in contact with a side surface of the reflective film 451A, a side surface of the first light transmitting wall 452A-1, and a side surface of the second light transmitting wall 452A-2.

Although the side surface of the first light transmitting wall 452A-1 and the side surface of the second light transmitting wall 452A-2 have a taper, the taper angles of the side surface of the first light transmitting wall 452A-1 and the side surface of the second light transmitting wall 452A-2 are different. The taper angle of the second light transmitting wall 452A-2 is larger than the taper angle of the first light transmitting wall 452A-1. Further, the first light transmitting wall 452A-1 and the second light transmitting wall 452A-2 may include the same material or may include different materials. However, a refractive index of the first light transmitting wall 452A-1 and a refractive index of the second light transmitting wall 452A-2 are larger than a refractive index of the light transmitting film 453A.

As described above, the refractive index of the first light transmitting wall 452A-1 and the refractive index of the second light transmitting wall 452A-2 are larger than the refractive index of the light transmitting film 453A. Therefore, the light L1 emitted from the side surface of the light emitting element 430A is reflected at the interface between the first light transmitting wall 452A-1 and the light transmitting film 453A. Further, the reflected light is reflected at the interface between the second light transmitting wall 452A-2 and the light transmitting film 453A. That is, the light L1 which travels through the light transmitting film 453A is reflected by the side surface of the first light transmitting wall 452A-1 and the second light transmitting wall 452A-2, and is extracted from an upper surface of the light transmitting film 453A. Therefore, the light emitted from the side surface of the light emitting element 430A is adjusted by the optical adjustment layer 436A so as to be extracted from the upper surface of the light emitting element 430A.

Modification 2

A modification of the optical adjustment layer 436 of the display device 40 according to the present embodiment is described with reference to FIG. 17.

Figure 17:
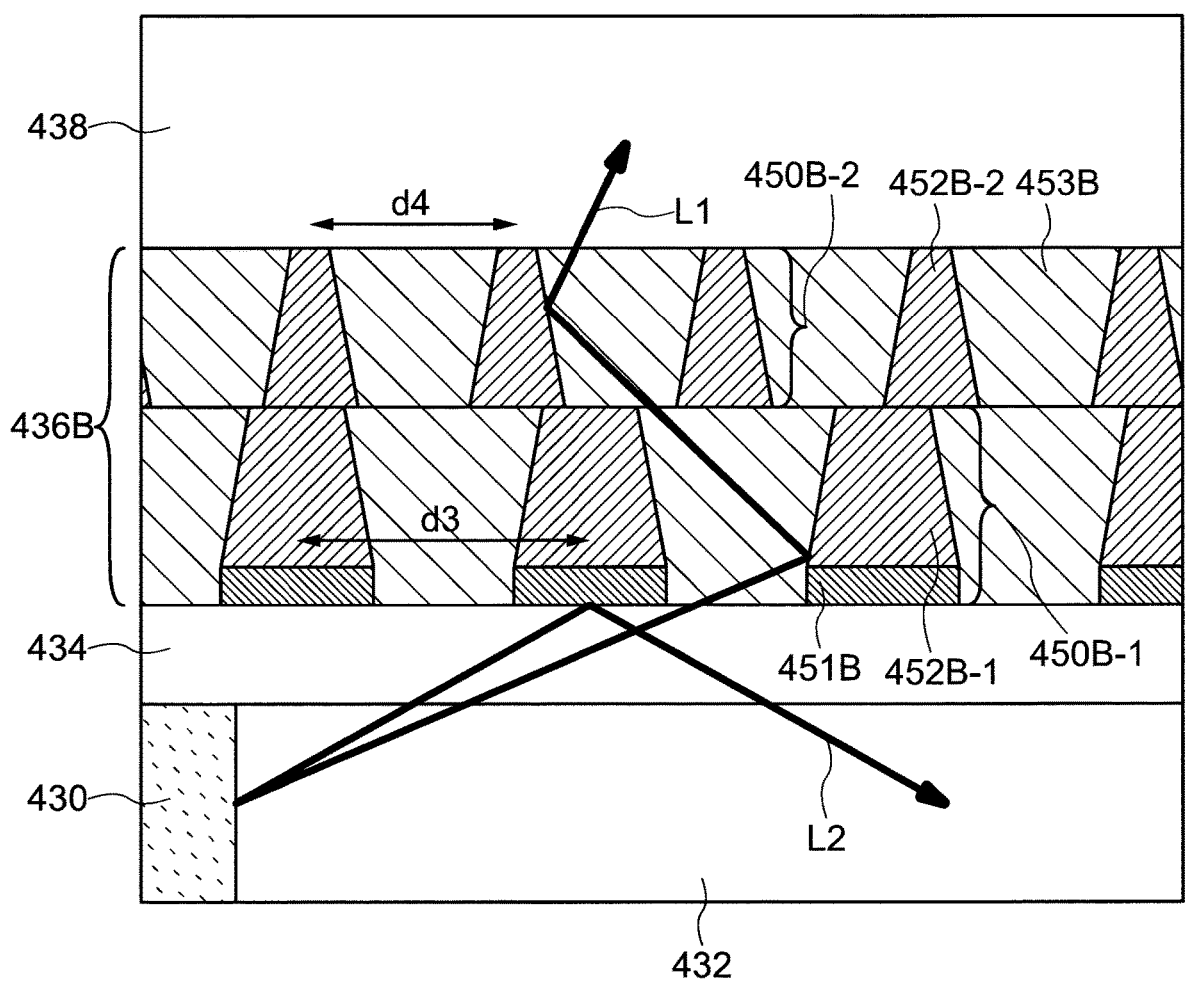
FIG. 17 is a schematic partial cross-sectional view of a display device according to an embodiment of the present invention.

FIG. 17 is a schematic partial cross-sectional view of a display device 40B according to the embodiment of the present invention. Specifically, FIG. 17 is a cross-sectional view of a portion of the display device 40B including the light emitting element 430 and an optical adjustment layer 436B. Hereinafter, the optical adjustment layer 436B is mainly described.

As shown in FIG. 17, the optical adjustment layer 436B includes a lower structure 450B-1, an upper structure 450B-2, and a light transmitting film 453B. The lower structure 450B-1 includes a reflective film 451B and a first light transmitting wall 452B-1 on the reflective film 451B. The upper structure 450B-2 includes a second light transmitting wall 452B-2. The upper structure 450B-2 is provided on the lower structure 450B-1. A light transmitting film 453B is provided so as to surround a side surface of the lower structure 450B-1 and a side surface of the upper structure 450B-2. In other words, the light transmitting film 153B is provided so as to be in contact with a side surface of the reflective film 451B, a side surface of the first light transmitting wall 452B-1, and a side surface of the second light transmitting wall 452B-2.

The side surface of the first light transmitting wall 452B-1 and the side surface of the second light transmitting wall 452B-2 have a taper. Although taper angles of the side surface of the first light transmitting wall 452B-1 and the side surface of the second light transmitting wall 452B-2 shown in FIG. 17 are the same, the taper angles may be different. The first light transmitting wall 452B-1 and the second light transmitting wall 452B-2 may include the same material or may include different materials. However, a refractive index of the first light transmitting wall 452B-1 and a refractive index of the second light transmitting wall 452B-2 are larger than a refractive index of the light transmitting film 453B.

The first light transmitting wall 452B-1 and the second light transmitting wall 452B-2 have different pitches between adjacent light transmitting walls. The pitch d3 between the first light transmitting walls 452B-1 is larger than the pitch d4 between the second light transmitting walls 452B-2 (d3>d4). The pitch d3 can be smaller than the pitch d4 (d3<d4).

As described above, the refractive index of the first light transmitting wall 452B-1 and the refractive index of the second light transmitting wall 452B-2 are larger than the refractive index of the light transmitting film 453B. Therefore, the light L1 emitted from the side surface of the light emitting element 430 is reflected at the interface between the first light transmitting wall 452B-1 and the light transmitting film 453B. Further, the reflected light is reflected at the interface between the second light transmitting wall 452B-2 and the light transmitting film 453B. That is, the light L1 which travels through the light transmitting film 453B is reflected by the side surface of the first light transmitting wall 452B-1 and the second light transmitting wall 452B-2, and is extracted from the upper surface of the light transmitting film 453B. Therefore, the light emitted from the side surface of the light emitting element 430 is adjusted by the optical adjustment layer 436B so as to be extracted from the upper surface of the light emitting element 430B.

Further, since the pitches of the lower structure 450B-1 and the upper structure 450B-2 are different, the reflection of light becomes irregular. Therefore, the display device 40B can display with suppressed interference fringes such as moire.

Fifth Embodiment

A method for manufacturing the display device 10 according to the embodiment of the present invention is described with reference to FIGS. 18A to 18E.

Each of FIGS. 18A to 18E is a schematic cross-sectional view of the display device 10 showing a manufacturing process of the optical adjustment layer 136 in the method for manufacturing the display device 10 according to the embodiment of the present invention.

Figure 18A:
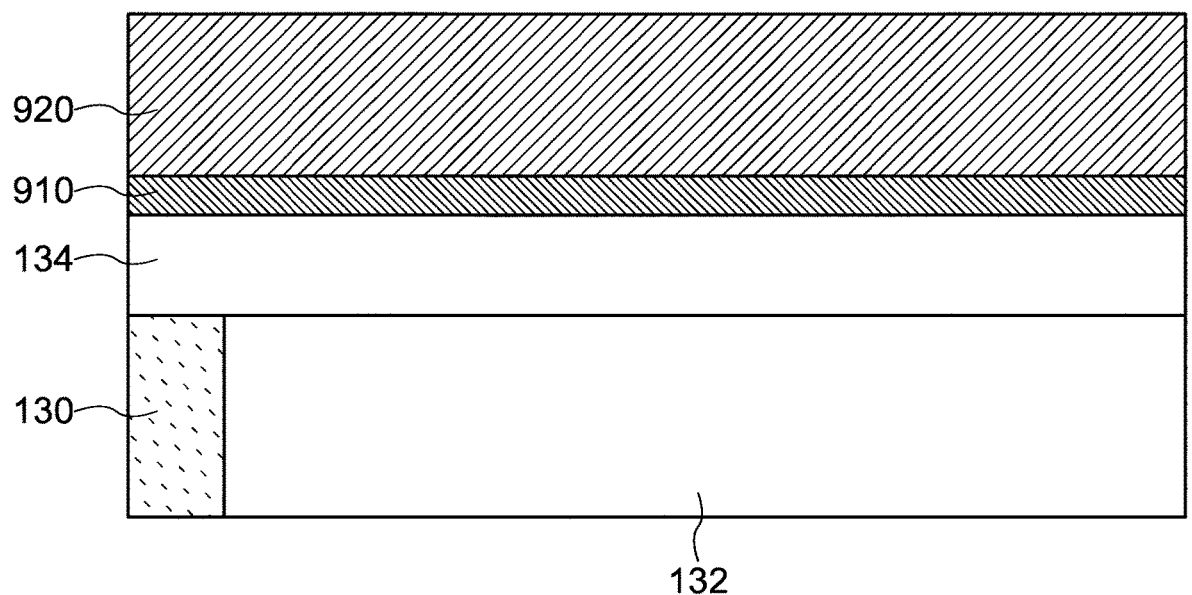
FIG. 18A is a schematic cross-sectional view of a display device showing a manufacturing process of an optical adjustment layer in a method for manufacturing a display device according to an embodiment of the present invention.

In the configuration in which the eighth wiring layer 134 is provided on the light emitting element 130 and the second flattening layer 132, a reflective material layer 910 and a high reflective index material layer 920 on the reflective material layer 910 are formed over the eighth wiring layer 134 (FIG. 18A). Here, a positive photosensitive resist is used as a material of the high refractive index material layer 920. Further, a metal material is used as a material of the reflective material layer 910.

Figure 18B:
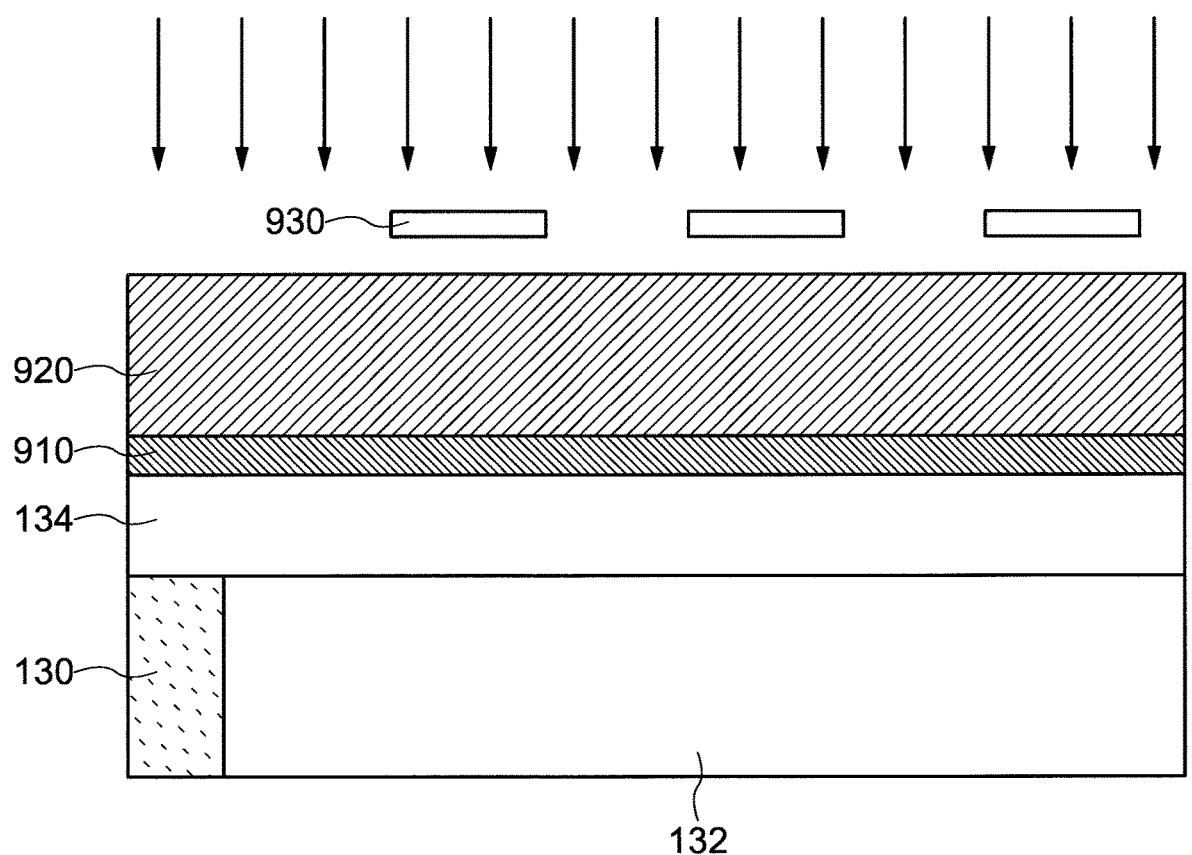
FIG. 18B is a schematic cross-sectional view of a display device showing a manufacturing process of an optical adjustment layer in a method for manufacturing a display device according to an embodiment of the present invention.

Next, the high refractive index material layer 920 is exposed via the photomask 930 (FIG. 18B). Since the high refractive index material layer 920 is a positive photosensitive resist, the portion which is irradiated with light is exposed. Further, since the irradiated light is attenuated when the light travels in the high refractive index material layer 920, the high refractive index material layer 920 is widely exposed in the upper portion and narrowly exposed in the lower portion.

Figure 18C:
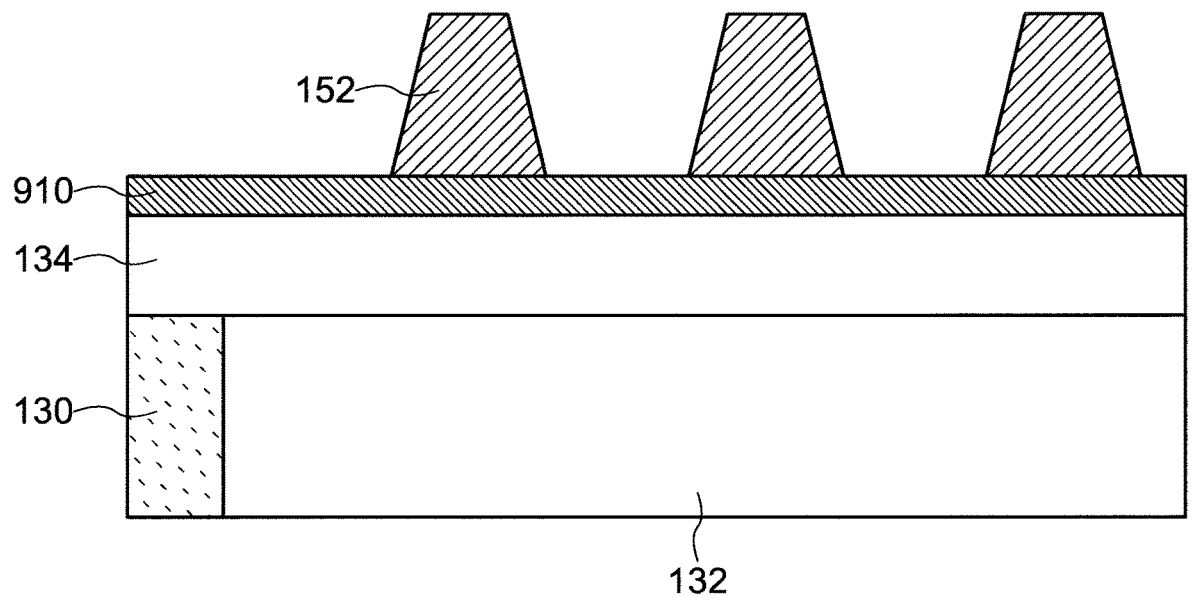
FIG. 18C is a schematic cross-sectional view of a display device showing a manufacturing process of an optical adjustment layer in a method for manufacturing a display device according to an embodiment of the present invention.

Next, the high refractive index material layer 920 is developed. The unexposed portion of the high refractive index material layer 920 remains, and the pattern of the light transmitting wall 152 is formed (FIG. 18C). As described above, since the degree of exposure differs between the upper portion and the lower portion of the high refractive index material layer 920, a taper is formed on the side surface of the light transmitting wall 152.

Figure 18D:
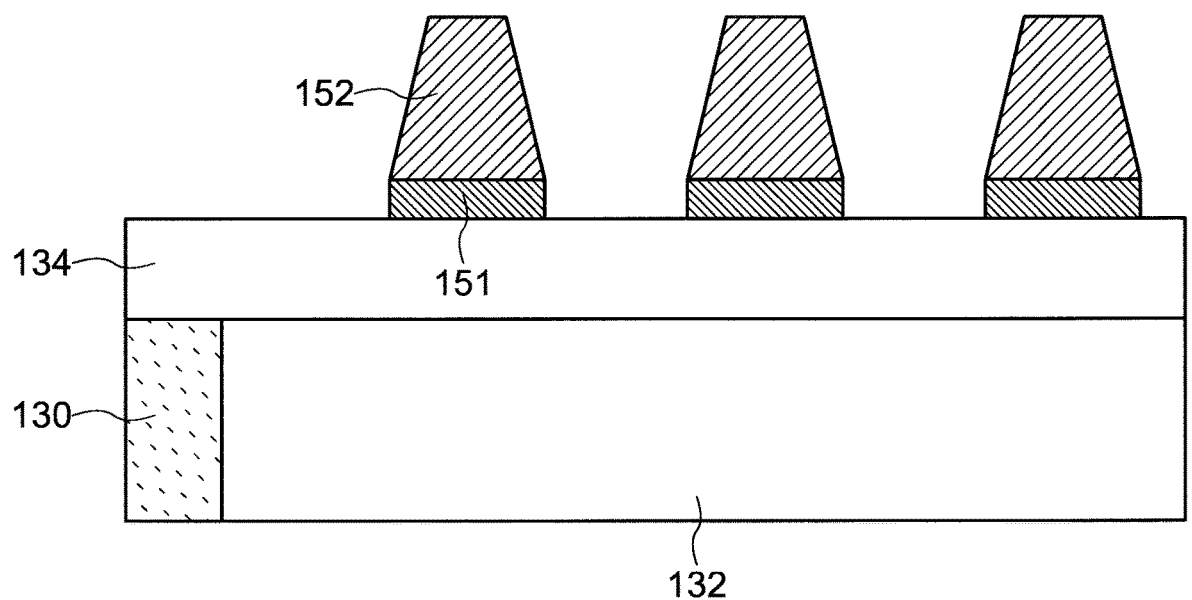
FIG. 18D is a schematic cross-sectional view of a display device showing a manufacturing process of an optical adjustment layer in a method for manufacturing a display device according to an embodiment of the present invention.

Next, the reflective material layer 910 is etched using the pattern of the light transmitting wall 152 as a mask. The reflective material layer 910 that overlaps the light transmitting wall 152 remains, and a reflective film 151 is formed under the light transmitting wall 152 (FIG. 18D). When the reflective material layer 910 is a metal material such as molybdenum, tungsten or aluminum, it can be easy to form the pattern of the reflective material layer 910 by wet etching.

Figure 18E:
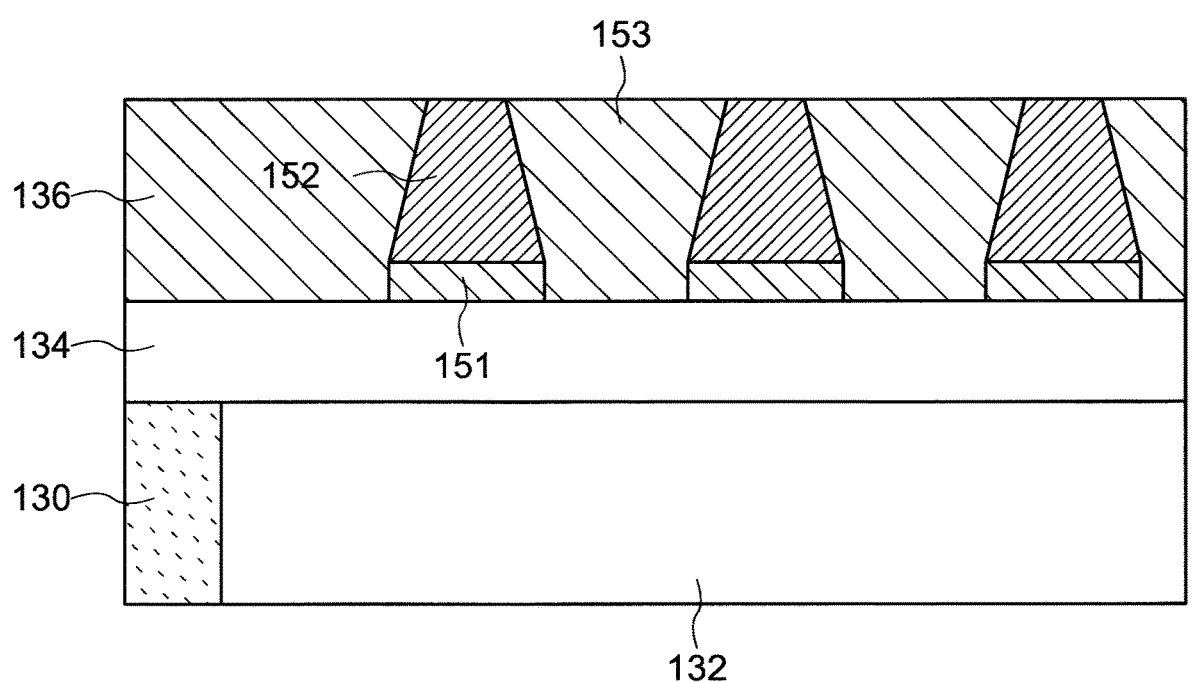
FIG. 18E is a schematic cross-sectional view of a display device showing a manufacturing process of an optical adjustment layer in a method for manufacturing a display device according to an embodiment of the present invention.

Finally, a low refractive index material is filled between the structure 150 having the reflective film 151 and the light transmitting wall 152 to form the light transmitting film 153 (FIG. 18E). For example, when a photocurable resin is used as a material of the light transmitting film 153, the photocurable resin can be applied in a state of having fluidity and can be cured by light irradiation.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on the respective embodiments are also included within the scope of the present invention as long as the gist of the present invention is provided.

Other effects which differ from those brought about by each of the above described embodiments, but which are apparent from the description herein or which can be readily predicted by those skilled in the art, are naturally understood to be brought about by the present invention.

What is claimed is:

1. A display device comprising:
    a light emitting element; and
    an optical adjustment layer over the light emitting element,
    wherein the optical adjustment layer comprises:
        a reflective film;
        a light transmitting wall over the reflection film; and
        a light transmitting film in contact with a side surface of the reflective film and a side surface of the light transmitting wall, and
    a refractive index of the light transmitting wall is larger than a refractive index of the light transmitting film.

2. The display device according to claim 1, wherein the side surface of the light transmitting wall has a taper.

3. The display device according to claim 1, wherein a shape of the light transmitting wall is a truncated cone, a polygonal frustum, a cone, or a polygonal pyramid.

4. The display device according to claim 1, wherein an area of a lower surface of the reflective film is smaller than an area of an upper surface of the light emitting element.

5. The display device according to claim 1, wherein the light emitting element is a light emitting diode.

6. A display device comprising:
    a light emitting element over a substrate; and
    an optical adjustment layer over the light emitting element,
    wherein the optical adjustment layer comprises:
        a first structure comprising a first reflective film and a first light transmitting wall over the first reflective film;
        a second structure comprising a second reflective film and a second light transmitting wall over the second reflective film; and
        a light transmitting film in contact with a side surface of the first structure and a side surface of the second structure,
    the first structure is provided in a region that does not overlap the light emitting element,
    the second structure is provided in a region that overlaps the light emitting element, and
    a refractive index of the first light transmitting wall and a refractive index of the second light transmitting wall are larger than a refractive index of the light transmitting film.

7. The display device according to claim 6, wherein a size of the first structure is larger than a size of the second structure.

8. The display device according to claim 6,
    wherein a side surface of the first light transmitting wall of the first structure has a first taper,
    the first taper has a first angle with respect to a surface of the substrate, a side surface of the second light transmitting wall of the second structure has a second taper, the second taper has a second angle with respect to the surface of the substrate, and the first angle is smaller than the second angle.

9. The display device according to claim 6, wherein a distance between two adjacent first structures comprising the first structure is smaller than a distance between two adjacent second structures comprising the second structure.

10. The display device according to claim 6, wherein a first shape of the first light transmitting wall of the first structure is different from a second shape of the second light transmitting wall of the second structure.

11. The display device according to claim 10, wherein the second shape of the second light transmitting wall of the second structure is a truncated cone, a polygonal frustum, a cone, or a polygonal pyramid.

12. The display device according to claim 6, wherein a first shape of the first light transmitting wall of the first structure comprises a shape of a portion extending along a side surface of the light emitting element.

13. The display device according to claim 12, wherein a second shape of the second light transmitting wall of the second structure is a truncated cone, a polygonal frustum, a cone, or a polygonal pyramid.

14. The display device according to claim 6, wherein the light emitting element is a light emitting diode.

15. A display device comprising:

a light emitting element over a substrate; and an optical adjustment layer over the light emitting element, wherein the optical adjustment layer comprises:

a lower structure comprising a reflective film and a first light transmitting wall over the reflective film;

an upper structure comprising a second light transmitting wall, over the lower structure; and a light transmitting film in contact with a side surface of the lower structure and a side surface of the upper structure, an area of a lower surface of the lower structure is larger than an area of a lower surface of the upper structure, and a refractive index of the first light transmitting wall and a refractive index of the second light transmitting wall are larger than a refractive index of the light transmitting film.

16. The display device according to claim 15, wherein a side surface of the first light transmitting wall of the lower structure has a first taper, the first taper has a first angle with respect to a surface of the substrate, a side surface of the second light transmitting wall of the upper structure has a second taper, the second taper has a second angle with respect to the surface of the substrate, and the first angle is smaller than the second angle.

17. The display device according to claim 15, wherein a distance between two adjacent lower structures comprising the lower structure is larger than a distance between two adjacent upper structures comprising the upper structure.

18. The display device according to claim 15, wherein one of a first shape of the first light transmitting wall of the lower structure and a second shape of the second light transmitting wall of the upper structure is a truncated cone, a polygonal frustum, a cone, or a polygonal pyramid.

19. The display device according to claim 15, wherein the light emitting element is a light emitting diode.

\* \* \* \* \*